United States Patent
Klayman et al.

(10) Patent No.: US 6,281,749 B1
(45) Date of Patent: Aug. 28, 2001

(54) SOUND ENHANCEMENT SYSTEM

(75) Inventors: Arnold I. Klayman, Huntington Beach; Alan D. Kraemer, Tustin, both of CA (US)

(73) Assignee: SRS Labs, Inc., Santa Ana, CA (US)

( * ) Notice: Subject to any disclaimer, the term of this patent is extended or adjusted under 35 U.S.C. 154(b) by 0 days.

(21) Appl. No.: 08/877,439

(22) Filed: Jun. 17, 1997

(51) Int. Cl.[7] .................................. H03F 3/45; H04R 5/00
(52) U.S. Cl. ......................... 330/252; 330/258; 330/69; 381/99; 381/1
(58) Field of Search .................................. 381/99, 98, 1, 381/28; 330/252, 258, 69; 375/318; 327/246

(56) References Cited

U.S. PATENT DOCUMENTS

| | | |
|---|---|---|
| 3,170,991 | 2/1965 | Glasgal . |
| 3,229,038 | 1/1966 | Richter . |
| 3,246,081 | 4/1966 | Edwards . |

(List continued on next page.)

FOREIGN PATENT DOCUMENTS

| | | |
|---|---|---|
| 0 097 982 A3 | 1/1984 | (EP) . |
| 0 312 406 A2 | 4/1989 | (EP) . |
| 0 320 270 A2 | 6/1989 | (EP) . |
| 0 354 517 A2 | 2/1990 | (EP) . |
| 0 357 402 A2 | 3/1990 | (EP) . |
| 0 526 880 A2 | 2/1993 | (EP) . |
| 0 637 191 A2 | 2/1995 | (EP) . |
| 0 699 012 A2 | 2/1996 | (EP) . |
| 2 154 835 A | 9/1985 | (GB) . |
| 2 277 855 A | 9/1994 | (GB) . |
| WO 87/06090 | 10/1987 | (WO) . |
| WO 91/19407 | 12/1991 | (WO) . |

OTHER PUBLICATIONS

Schroeder, M.R., "An Artificial Stereophonic Effect Obtained from a Single Audio Signal". *Journal of the Audio Engineering Society*, vol. 6, No. 2, pp. 74–79, Apr. 1958.

Kurozumi, K., et al., "A New Sound Image Broadening Control System Using a Correlation Coefficient Variation Method", *Electronics and Communications in Japan*, vol. 67–A, No. 3, pp. 204–211, Mar. 1984.

Sundberg, J., "The Acoustics of the Singing Voice", *The Physics of Music*, pp. 16–23, 1978.

Ishihara, M., "A New Analog Signal Processor For A Stereo Enhancement System", *IEEE Transactions on Consumer Electronics*, vol. 37, No. 4, pp 806–813, Nov. 1991.

Allison, R., "The Loudspeaker / Living Room System", *Audio*, pp. 18–22, Nov. 1971.

Vaughan, D., "How We Hear Direction", *Audio*, pp. 51–55, Dec. 1983.

Stevens, S., et al., "Chapter 5: The Two–Earned man", *Sound And Hearing*, pp. 98–106 and 196, 1965.

Eargle, J., "Multichannel Stereo Matrix Systems: An Overview", *Journal of the Audio Engineering Society*, pp. 552–558 (no date listed).

Wilson, Kim, "AC–3 Is Here! But Are You Ready To Pay The Price?", *Home Theater*, pp. 60–65, Jun. 1995.

*Primary Examiner*—Forester W. Isen
*Assistant Examiner*—Brian Tyrone Pendleton
(74) *Attorney, Agent, or Firm*—Knobbe, Martens, Olson & Bear LLP

(57) ABSTRACT

The present invention provides an audio enhancement apparatus and method which spectrally shapes the differential information in a pair of audio signals so as to create an immersive, three-dimensional effect when the audio signals are acoustically reproduced. In a preferred embodiment, the invention includes a two-transistor amplifier which spectrally shapes the differential information with what are called cross-over networks. The cross-over networks spectrally shape the differential information by selectively emphasizing or de-emphasizing certain frequencies in the differential information. In addition, the preferred embodiment adjusts the level of the sound which is common to both input signals to reduce clipping.

57 Claims, 15 Drawing Sheets

U.S. PATENT DOCUMENTS

| | | |
|---|---|---|
| 3,249,696 | 5/1966 | Van Sickle . |
| 3,665,105 | 5/1972 | Chowning . |
| 3,697,692 | 10/1972 | Hafler . |
| 3,725,586 | 4/1973 | Iida . |
| 3,745,254 | 7/1973 | Ohta et al. . |
| 3,757,047 | 9/1973 | Ito et al. . |
| 3,761,631 | 9/1973 | Ito et al. . |
| 3,769,459 | 10/1973 | Niffenegger et al. . |
| 3,772,479 | 11/1973 | Hilbert . |
| 3,849,600 | 11/1974 | Ohshima . |
| 3,849,601 | 11/1974 | Goncharoff . |
| 3,885,101 | 5/1975 | Ito et al. . |
| 3,892,624 | 7/1975 | Shimada . |
| 3,925,615 | 12/1975 | Nakano . |
| 3,943,293 | 3/1976 | Bailey . |
| 4,021,610 | 5/1977 | Gay . |
| 4,024,344 | 5/1977 | Dolby et al. . |
| 4,063,034 | 12/1977 | Peters . |
| 4,069,394 | 1/1978 | Doi et al. . |
| 4,118,599 | 10/1978 | Iwahara et al. . |
| 4,139,728 | 2/1979 | Haramoto et al. . |
| 4,192,969 | 3/1980 | Iwahara . |
| 4,204,092 | 5/1980 | Bruney . |
| 4,209,665 | 6/1980 | Iwahara . |
| 4,218,583 | 8/1980 | Poulo . |
| 4,218,585 | 8/1980 | Carver . |
| 4,219,696 | 8/1980 | Kogure et al. . |
| 4,237,343 | 12/1980 | Kurtin et al. . |
| 4,239,937 | 12/1980 | Kampmann . |
| 4,303,800 | 12/1981 | DeFreitas . |
| 4,306,113 | 12/1981 | Morton . |
| 4,308,423 | 12/1981 | Cohen . |
| 4,308,424 | 12/1981 | Bice, Jr. . |
| 4,309,570 | 1/1982 | Carver . |
| 4,332,979 | 6/1982 | Fischer . |
| 4,349,698 | 9/1982 | Iwahara . |
| 4,355,206 | 10/1982 | Cohen . |
| 4,356,349 | 10/1982 | Robinson . |
| 4,393,270 | 7/1983 | Van Den Berg . |
| 4,394,536 | 7/1983 | Shima et al. . |
| 4,408,095 | 10/1983 | Ariga et al. . |
| 4,418,248 | * 11/1983 | Mathis . |
| 4,479,235 | 10/1984 | Griffis . |
| 4,489,432 | 12/1984 | Polk . |
| 4,495,637 | 1/1985 | Bruney . |
| 4,497,064 | 1/1985 | Polk . |
| 4,503,554 | 3/1985 | Davis . |
| 4,567,607 | 1/1986 | Bruney et al. . |
| 4,569,074 | 2/1986 | Polk . |
| 4,589,129 | 5/1986 | Blackmer et al. . |
| 4,594,610 | 6/1986 | Patel . |
| 4,594,729 | 6/1986 | Weingartner . |
| 4,594,730 | 6/1986 | Rosen . |
| 4,622,691 | 11/1986 | Tokumo et al. . |
| 4,648,117 | 3/1987 | Kunugi et al. . |
| 4,696,036 | 9/1987 | Julstrom . |
| 4,703,502 | 10/1987 | Kasai et al. . |
| 4,748,669 | 5/1988 | Klayman . |
| 4,803,727 | 2/1989 | Holt et al. . |
| 4,837,824 | 6/1989 | Orban . |
| 4,841,572 | 6/1989 | Klayman . |
| 4,851,719 | * 7/1989 | Hitomi ................................. 307/521 |
| 4,856,064 | 8/1989 | Iwamatsu . |
| 4,866,774 | 9/1989 | Klayman . |
| 4,866,776 | 9/1989 | Kasai et al. . |
| 4,888,809 | 12/1989 | Knibbeler . |
| 4,891,841 | 1/1990 | Bohn . |
| 4,910,779 | 3/1990 | Cooper et al. . |
| 4,953,213 | 8/1990 | Tasaki et al. . |
| 4,955,058 | 9/1990 | Rimkeit et al. . |
| 5,033,092 | 7/1991 | Sadaie . |
| 5,042,068 | 8/1991 | Scholten et al. . |
| 5,046,097 | 9/1991 | Lowe et al. . |
| 5,105,462 | 4/1992 | Lowe et al. . |
| 5,146,507 | 9/1992 | Satoh et al. . |
| 5,208,860 | 5/1993 | Lowe et al. . |
| 5,228,085 | 7/1993 | Aylward . |
| 5,251,260 | 10/1993 | Gates . |
| 5,255,326 | 10/1993 | Stevenson . |
| 5,319,713 | 6/1994 | Waller, Jr. et al . |
| 5,325,435 | 6/1994 | Date et al. . |
| 5,371,799 | 12/1994 | Lowe et al. . |
| 5,400,405 | 3/1995 | Petroff . |
| 5,425,106 | 6/1995 | Katz et al. . |
| 5,533,129 | 7/1996 | Gerfert . |
| 5,677,957 | * 10/1997 | Hulsebus ................................. 381/1 |
| 5,708,391 | * 1/1998 | Altmann et al. ...................... 330/252 |
| 5,736,899 | * 4/1998 | Bowers et al. ....................... 330/252 |
| 5,754,668 | * 5/1998 | Funahashi et al. ................. 381/101 |
| 5,900,779 | * 5/1999 | Giacomini ............................ 330/252 |
| 6,011,435 | * 1/2000 | Takeyabu et al. ................... 330/252 |

* cited by examiner

SOUND ENHANCEMENT SYSTEM

FIELD OF THE INVENTION

This invention relates generally to audio enhancement systems and methods for improving the realism of sound reproduction. More particularly, this invention relates to apparatus and methods for enhancing a pair of audio signals to create an immersive, three-dimensional effect when the audio signals are acoustically reproduced.

BACKGROUND

The audio and multimedia industries have continually strived to overcome the imperfections of reproduced sound. For example, a common imperfection is that the recording of sounds emanating from multiple locations is not properly reproduced in an audio system. One approach directed to improving the reproduction of sound includes surround sound systems which have multiple recording tracks. The multiple recording tracks are used to record the spatial information associated with sounds which emanate from multiple locations.

For example, in a surround sound system, some of the recording tracks contain sounds which are intended to originate from in front of the listener, while other recording tracks contain sounds which are intended to originate from behind the listener. When multiple speakers are placed around the listener at positions representing the intended origin of the recorded sounds, the audio information contained in the recording tracks makes the produced sounds appear more realistic to the listener. Such systems, however, are typically more expensive than systems which do not use multiple recording tracks and multiple speaker arrangements.

To conserve costs, many conventional two-speaker systems attempt to simulate a surround sound experience by introducing unnatural time-delays or phase-shifts between left and right signal sources. Unfortunately, such systems often suffer from unrealistic effects in the reproduced sound.

Other known sound enhancement techniques operate on what are called "sum" and "difference" signals. The sum signal, which is also called the monophonic signal, is the sum of the left and right signals. This can be conceptionalized as adding or combining the left and right signals (L+R).

The difference signal, on the other hand, represents the difference between the left and right audio signals. This is best conceptionalized as subtracting the right signal from the left signal (L−R). The difference signal is also often called the ambient signal.

It is known that modifying certain frequencies in the difference signal can widen the perceived sound projected from the left and right speakers. The widened sound image typically results from altering the reverberant sounds which are present in the difference signal. Sound enhancement techniques which process sum and difference signals is disclosed in U.S. Pat. Nos. 4,748,669 and 4,866,774, both issued to Arnold Klayman, one of the inventors for the invention disclosed in the present application.

In existing sound enhancement systems which process the sum and difference signals, the sum and difference signals are generated from circuitry which combines the left and right input signals. In some systems, once the circuitry generates the sum and difference signals, additional circuitry then separately processes and recombines the sum and difference signals in order to produce an enhanced sound effect. For example, the sound system disclosed in U.S. Pat. No. 4,748,669 has a sum and difference signal generator. Also, the sound system disclosed in U.S. Pat. No. 4,308,423 has a difference signal generator.

Typically, the creation and processing of the sum and difference signals are accomplished with digital signal processors, operational amplifiers and the like. Such implementations usually require complicated circuitry which increases the cost of such systems. Thus, despite the contributions from the prior art, there exists a need for a simplified audio enhancement system which reduces costs associated with producing an enhanced listening experience.

SUMMARY OF THE INVENTION

The present invention provides a unique apparatus and method which simplifies the enhancement of audio information and provides a widened stereo image. This is accomplished by correcting the perspective of audio information through the modification of the differential information existing in the audio information. Advantageously, the preferred sound enhancement system uses fewer components than the prior art sound enhancement systems and thus reduces the costs of enhancing audio signals. As a result, the preferred sound enhancement apparatus is easy to manufacture and costs less than many other sound enhancement devices.

In addition, the preferred sound enhancement apparatus enhances audio information without generating discrete sum and difference signals. As a result, the preferred embodiment does not need the complex circuitry which processes audio input signals to generate intermediate signals which are then separately processed and recombined to generate enhanced output signals. Advantageously, the preferred embodiment can be used to enhance sound in a wide range of low-cost audio and audio-visual devices which by way of example can include radios, mobile audio systems, computer games, multimedia presentation devices and the like.

Broadly speaking, the sound enhancement apparatus receives at least two input signals, from a host system and in turn, generates two enhanced output signals. In particular, the two input signals are processed collectively to provide a pair of spatially corrected output signals. In addition, the preferred embodiment modifies the audio information which is common to both input signals in a different manner than the audio information which is not common to both input signals.

The audio information which is common to both input signals is referred to as the common-mode information, or the common-mode signal. The common-mode audio information differs from a sum signal in that rather than containing the sum of the input signals, it contains only that audio information which exists in both input signals at any given instant in time. In addition, the preferred embodiment reduces the amplitude of the frequencies in the common-mode signal in order to reduce the clipping which may result from high-amplitude input signals.

In contrast, the audio information which is not common to both input signals is referred to as the differential information or the differential signal. Although the differential information is processed in a different manner than the common-mode information, the differential information is not processed to form a discrete signal. Rather, the common-mode and differential information are processed together.

As discussed in more detail below, the sound enhancement system spectrally shapes the differential signal with a variety of filters to create an equalized differential signal. By equalizing selected frequency bands within the differential signal, the sound enhancement apparatus widens a perceived sound image projected from a pair of loudspeakers placed in front of a listener.

As discussed in more detail below, the preferred sound enhancement apparatus includes two transistors which are interconnected at their emitters and their collectors with multiple cross-over networks. Preferably, the cross-over networks act as filters which equalize desired frequency ranges in the differential input. Thus, the differential gain varies based on the frequency of the input signals.

Because the cross-over networks equalize the frequency ranges in the differential input, the frequencies in the differential signal can be altered without affecting the frequencies in the common-mode signal. As a result, the preferred embodiment can create enhanced audio sound in an entirely unique and novel manner.

The preferred sound enhancement apparatus is in turn, connected to one or more output buffers. The output buffers isolate the sound enhancement apparatus from other components connected to the first and second output signals. For example, the output signals can be directed to other audio devices such as a recording device, a power amplifier, a pair of loudspeakers and the like without affecting the operation of the preferred sound enhancement apparatus.

BRIEF DESCRIPTION OF THE DRAWINGS

These and other aspects, advantages, and novel features of the invention will become apparent upon reading the following detailed description and upon reference to the accompanying drawings in which.

Figure 1:
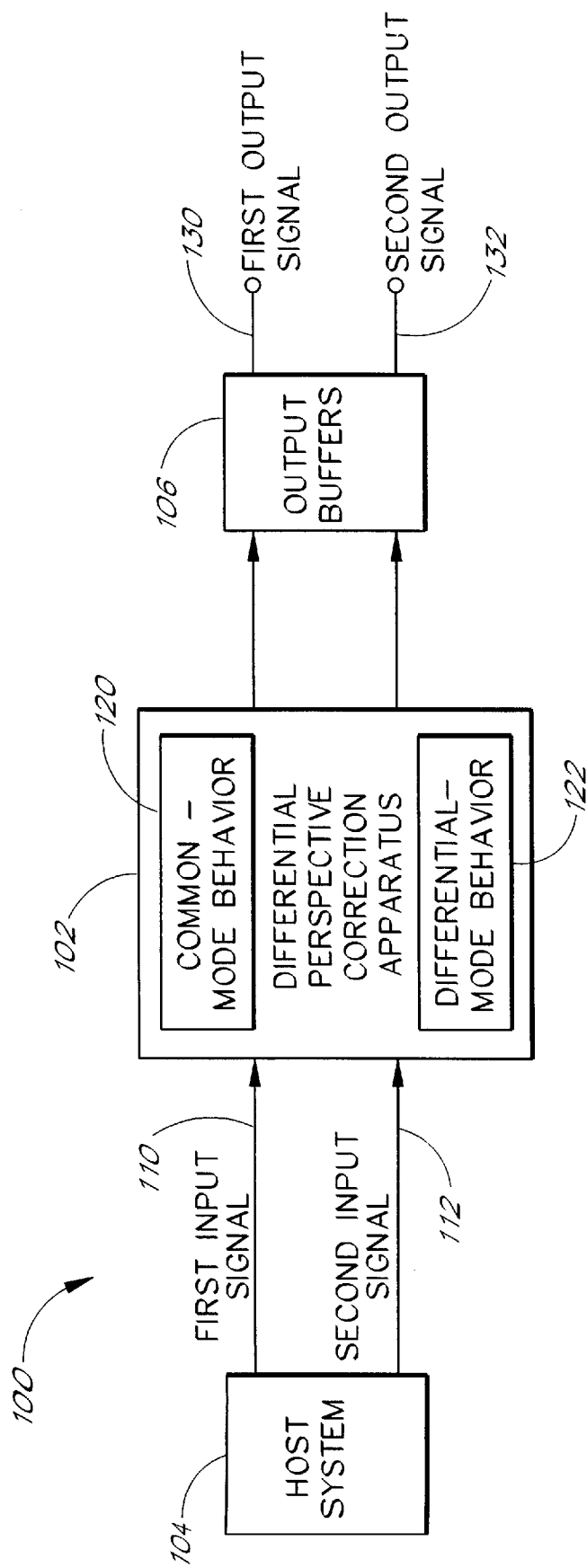
FIG. 1 is a block diagram of an audio system appropriate for use with the preferred embodiment of the present invention.

In the drawings, the first digit of any three-digit number indicates the number of the figure in which the element first appears. For example, an element with the reference number 302 first appears in FIG. 3.

DETAILED DESCRIPTION OF THE PREFERRED EMBODIMENTS

The present invention provides a method and system for enhancing audio signals. In a preferred embodiment, the sound enhancement system improves the realism of sound with a unique sound enhancement apparatus. Generally speaking, the sound enhancement apparatus receives two input signals, a left input signal and a right input signal, and in turn, generates two enhanced output signals, a left output signal and a right output signal.

The left and right input signals are processed collectively to provide a pair of spatially corrected left and right output signals. In particular, the preferred embodiment equalizes the differences which exist between the two input signals in a manner which broadens and enhances the sound perceived by the listener. In addition, the preferred embodiment adjusts the level of the sound which is common to both input signals so as to reduce clipping. Advantageously, the preferred embodiment achieves sound enhancement with a simplified, low-cost, and easy-to-manufacture circuit which does not require separate circuits to process the common and differential signals.

Although the preferred embodiment is described herein with reference to a preferred sound enhancement system, the invention is not so limited, and can be used in a variety of other contexts in which it is desirable to adapt different embodiments of the sound enhancement system to different situations. To facilitate a complete understanding of the invention, the remainder of the detailed description is organized into the following sections and subsections:

I. Overview Of A Sound Enhancement System Appropriate For Use With The Preferred Sound Enhancement Apparatus II. Overview Of A Differential Amplifier III. Implementation Of The Preferred Differential Perspective Correction Apparatus IV. Operation Of the Preferred Differential Perspective Correction Apparatus
   A. The Common-Mode Gain
   B. The Differential Gain
   C. Other Embodiments
   D. The Output Buffers V. Conclusion I. Overview of a Sound Enhancement System Appropriate for use with the Preferred Sound Enhancement Apparatus FIG. 1 illustrates a block diagram of a sound enhancement system 100 appropriate for use with the preferred sound enhancement apparatus 102. The preferred sound enhancement system 100 includes a host system 104, the sound enhancement apparatus 102 and a set of output buffers 106. In the preferred embodiment, the host system 104 is an audio generator which generates two audio signals, a first input signal 110 and a second input signal 112.

The host system 104 can include, by way of example, a stereo receiver, a radio, a compact disc player, a video cassette recorder (VCR), audio amplifiers, theater systems, televisions, laser disc players, digital versatile disk (DVD) players, devices for recording and playback of prerecorded audio, multimedia devices, computer games and the like. While the host system generates a set of stereo signals; it should be understood that the host system 104 is not limited to stereo signals. Thus, in other embodiments, the host system 104 can generate a wide variety of audio signals such as audio systems which generate multi-channel signals.

The host system 104 transmits the first and second input signals 110 and 112 to the sound enhancement system 102. Because the preferred sound enhancement system 102 corrects the perspective of audio information through modification of the differential signal, the sound enhancement apparatus 102 is also referred to as the differential perspective correction apparatus 102. In the preferred embodiment the first and second input signals 110 and 112 are stereo signals; however, the first and second input signals 110 and 112 need not be stereo signals and can include a wide range of audio signals such as Dolby Laboratories Pro-Logic system which uses a matrixing scheme to store four or more separate audio channels on just two audio recording tracks.

The audio signals could also include surround sound systems which can deliver completely separate forward and rear audio channels. One such system is Dolby Laboratories five-channel digital system dubbed "AC-3." As explained in more detail below, the preferred differential perspective correction apparatus 102 modifies the audio sound information which is common to both the first and second input signals 110 and 112 in a different manner than the audio sound information which is not common to both the first and second input signals 110 and 112.

The audio information which is common to both the first and second input signals 110 and 112 is referred to as the common-mode information, or the common-mode signal (not shown). In the preferred embodiment, the common-mode signal does not exist as a discrete signal. Accordingly, the term common-mode signal is used throughout this detailed description to conceptionally refer to the audio information which exists equally in both the first and second input signals 110 and 112 at any instant in time. For example, if a one-volt signal is applied to both the first and second input signals 110 and 112, the common-mode signal consists of one volt.

The adjustment of the common-mode signal is shown conceptionally in the common-mode behavior block 120. The common-mode behavior block 120 represents the alteration of the common-mode signal. The preferred embodiment reduces the amplitude of the frequencies in the common-mode signal in order to reduce the clipping which may result from high-amplitude input signals.

In contrast, the audio information which is not common to both the first and second input signals 110 and 112 is referred to as the differential information or the differential signal (not shown). In the preferred embodiment, the differential signal is not a discrete signal. Rather, throughout this detailed description, the differential signal refers to the audio information which represents the difference between the first and second input signals 110 and 112 over time. For example, if, at a given point in time, the first input signal 110 is zero volts and the second input signal 112 is two volts, the differential signal at that point in time is two volts (the difference between the two input signals 110 and 112). The differential signal will thus vary as a function of time depending upon the signals received at the inputs. The rate at which the differential signal varies over time can be described in terms of frequency. Thus, the differential signal may have individual components existing throughout the entire frequency spectrum, depending upon the rate of fluctuation between the corresponding input signals.

The modification of the differential signal is shown conceptionally in the differential-mode behavior block 122. As discussed in more detail below, the differential perspective correction apparatus 102 equalizes selected frequency bands in the differential signal. That is, the preferred embodiment equalizes the audio information in the differential signal in a different manner than the audio information in the common-mode signal.

The preferred differential perspective correction apparatus 102 spectrally shapes the differential signal in the differential-mode behavior block 122 with a variety of filters to create an equalized differential signal. By equalizing selected frequency bands within the differential signal, the differential perspective correction apparatus 102 widens a perceived sound image projected from a pair of loudspeakers placed in front of a listener.

Furthermore, while the common-mode behavior block 120 and the differential-mode behavior block 122 are represented conceptionally as separate blocks, the preferred embodiment performs these functions with a single, uniquely adapted circuit Thus, the preferred embodiment processes both the common-mode and differential audio information simultaneously. Advantageously, the preferred embodiment does not require the complicated circuitry to separate the audio input signals into discrete common-mode and differential signals. In addition, the preferred embodiment doesn't require a mixer which then recombines the processed common-mode signals and the processed differential signals to generate a set of enhanced output signals.

The preferred differential perspective correction apparatus 102 is in turn, connected to one or more output buffers 106. The output buffers 106 output the enhanced first output signal 130 and second output signal 132. As discussed in more detail below, the output buffers 106 isolate the differential perspective correction apparatus 102 from other components connected to the first and second output signals 130 and 132. For example, the first and second output signals 130 and 132 can be directed to other audio devices such as a recording device, a power amplifier, a pair of loudspeakers and the like without altering the operation of the preferred differential perspective correction apparatus 102.

II. Overview of a Differential Amplifier

Figure 2:
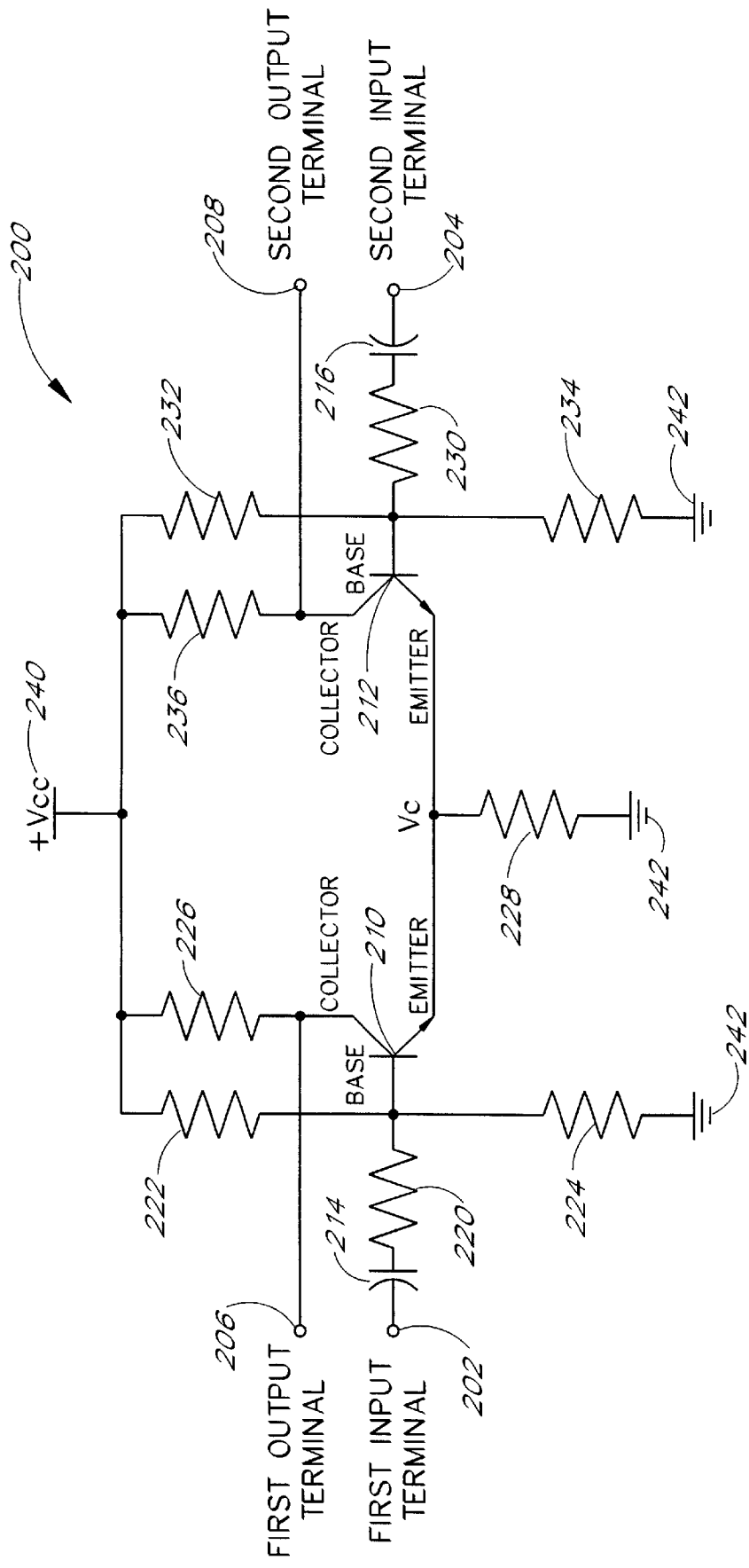
FIG. 2 is a schematic diagram of a common-emitter differential amplifier.

FIG. 2 illustrates a prior-art, common-emitter differential amplifier 200. The common-emitter differential amplifier 200 (hereinafter referred to simply as a differential amplifier) responds to the difference in the amplitude between two input signals applied at a first input terminal 202 and a second input terminal 204. The differential amplifier 200 also has two output terminals illustrated as a first output terminal 206 and a second output terminal 208.

The differential amplifier 200 responds to the difference in the amplitude between the input signals applied at the first and second input terminals 202 and 204. In general, when two identical signals are applied to the first and second input terminals 202 and 204, the output at the first and second output terminals 206 and 208 is zero. On the other hand, when two different signals are applied to the first and second input terminals 202 and 204, the greater the difference in the amplitudes for a given frequency, the greater the amplitude generated at the output terminals 206 and 208 for that frequency.

The differential amplifier also includes two transistors 210 and 212, a plurality of capacitors 214 and 216, and a plurality of resistors, 220, 222, 224, 226, 228, 230, 232, 234 and 236. The transistors, capacitors and resistors are arranged such that the first input terminal 202 transmits a first input signal (not shown) from the first input terminal 202 to the base of the transistor 210 through the capacitor 214 and the resistor 220. A power supply $V_{CC}$ 240 is connected to the base of transistor 210 through the resistor 222 and to the collector of transistor 210 through the resistor 226. The base of transistor 210 is also connected to ground 242 through the resistor 224 while the emitter of transistor 210 is connected to ground 242 through the resistor 228.

Focusing now on the second input terminal 204, the second input terminal transmits a second input signal (not shown) to the base of the transistor 212 through the capacitor 216 and the resistor 230. The power supply $V_{CC}$ 240 is connected to the base of transistor 212 through the resistor 232. In addition, the power supply $V_{CC}$ 240 is connected to the collector of transistor 212 through the resistor 236. The base of transistor 212 is also connected to ground 242 through the resistor 234. In addition, the emitter of transistor 212 is connected to ground 242 through the resistor 228.

This conventional differential amplifier 200 creates two types of voltage gains (not shown), a common-mode voltage gain and a differential voltage gain. The common-mode gain is defined as the change between the input and the output of the common-mode signal. The common-mode gain is typically expressed as the ratio of the common-mode output voltage divided by the common-mode input voltage.

For example, assume that at a particular instant in time, the identical signal having a two-volt amplitude is applied to both the first input terminal 202 and the second input terminal 204. In this example, the common-mode input voltage is two volts because a two volt value exists on both the first input terminal 202 and the second input terminal 204. If, in this example, the common-mode output voltage is 3 volts, the common-mode gain will equal 1.5 (3 common-mode output volts/2 common-mode input volts).

Focusing now on the differential gain, the differential gain is defined as the ratio of the differential input voltage and the differential output voltage. For example, assume that a particular instant in time, the voltage of the first input terminal 202 is one volt and the voltage at the second input terminal 204 is zero volts. In this example, the differential signal is one volt (1–0). If the differential voltage at the first output terminal 206 is two volts, the differential gain equals 2, the 2 volt differential voltage output divided by the one volt differential input voltage.

Figure 3:
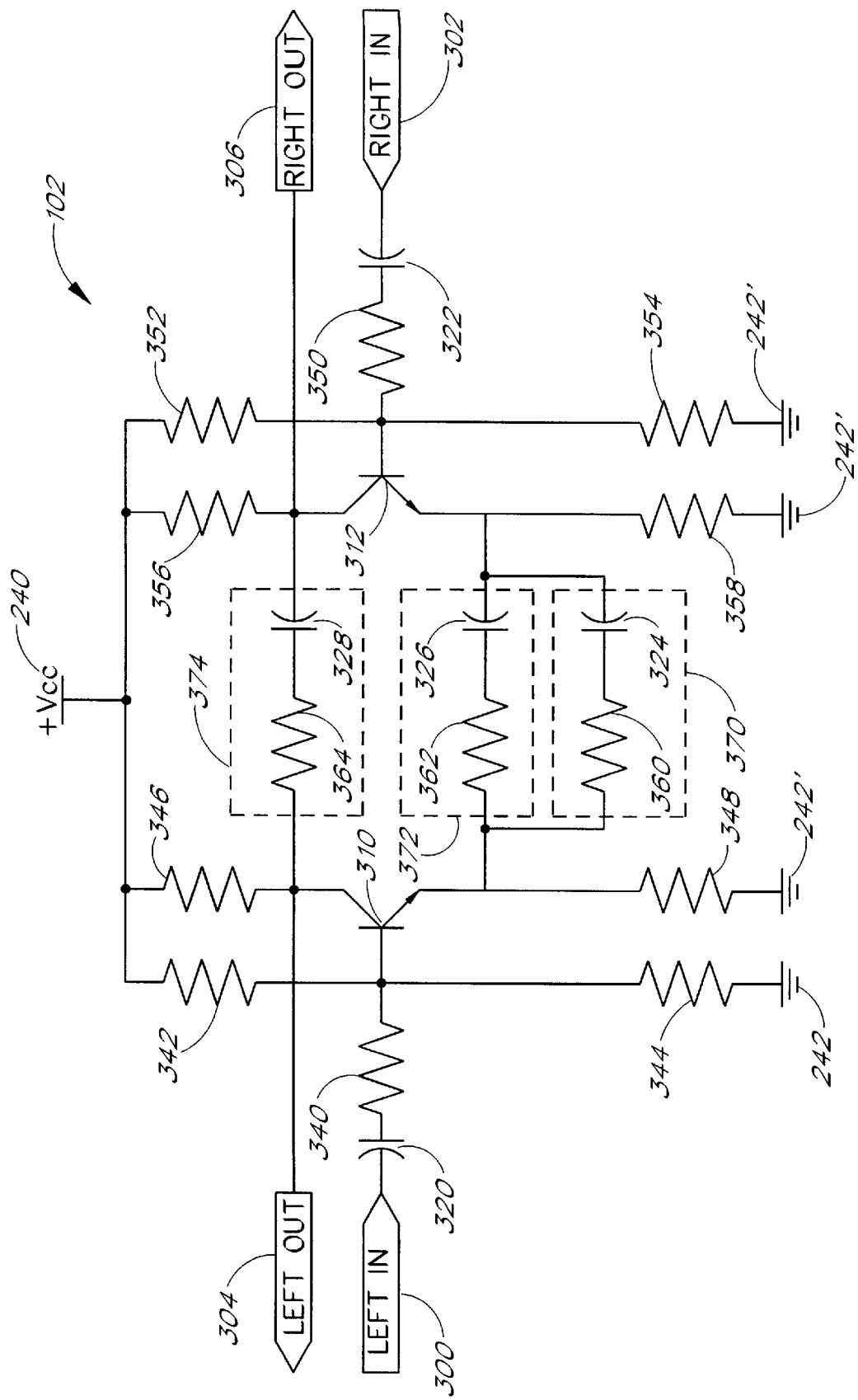
FIG. 3 is a schematic diagram of a preferred sound enhancement apparatus.

III. Implementation of the Preferred Differential Perspective Correction Apparatus FIG. 3 illustrates a schematic diagram of the preferred differential perspective correction apparatus 102. The preferred differential perspective correction apparatus 102 includes a unique differential amplifier which adjusts the level of the common-mode signal while equalizing select frequency bands in the differential signal.

The preferred differential perspective correction apparatus 102 includes two transistors 310 and 312; multiple capacitors 320, 322, 324, 326 and 328; and multiple resistors 340, 342, 344, 346, 348, 350, 352, 354, 356, 358, 360, 362 and 364. Located between the transistors 310 and 312 are three cross-over networks 370, 372 and 374. The first cross-over network 370 includes the resistor 360 and the capacitor 324. The second cross-over network 372 includes the resistor 362 and the capacitor 326, and the third cross-over network 374 includes the resistor 364 and the capacitor 328.

A left input terminal 300 (LEFT IN) transmits the left input signal (not shown) to the base of transistor 310 through the capacitor 320 and the resistor 340. A power supply $V_{CC}$ 240 is connected to the base of transistor 310 through the resistor 342. The power supply $V_{CC}$ 240 is also connected to the collector of transistor 310 through resistor 346. The base of transistor 310 is also connected to ground 242 through the resistor 344 while the emitter of transistor 310 is connected to ground 242 through the resistor 348.

The capacitor 320 is a decoupling capacitor which provides direct current (DC) isolation of the input signal at the left input terminal 300. The resistors 342, 344, 346 and 348, on the other hand, create a bias circuit which ensures stable operation of the transistor 310. In particular, the resistors 342 and 344 set the base voltage of transistor 310. The resistor 346 in combination with the third cross-over network 374 set the DC value of the collector-to-emitter voltage of the transistor 310. The resistor 348 in combination with the first and second cross-over networks 370 and 372 set the DC current of the emitter of the transistor 310.

In the preferred embodiment, the transistor 310 is an npn 2N2222A transistor which is commonly available from a wide variety of transistor manufacturers. The capacitor 320 is 0.22 microfarads. The resistor 340 is 22 kilohms (kohm), the resistor 342 is 41.2 kohm, the resistor 346 is 10 kohm, and the resistor 348 is 6.8 kohm. One of ordinary skill in the art will recognize, however, that a variety of transistors, capacitors and resistors with different values can be used to implement the differential perspective correction apparatus 102.

Focusing now on the right input terminal 302, the right input terminal 302 transmits a right input signal (not shown) to the base of transistor 312 through the capacitor 322 and the resistor 350. The power supply $V_{CC}$ 240 is connected to the base of transistor 312 through the resistor 352. The power supply $V_{CC}$ 240 is also connected to the collector of transistor 312 through the resistor 356. The base of transistor 312 is also connected to ground 242 through the resistor 354 while the emitter of transistor 312 is connected to ground 242 through the resistor 358.

The capacitor 322 is a decoupling capacitor which provides direct current (DC) isolation of the input signal at the right input terminal 302. The resistors 352, 354, 356 and 358, on the other hand, create a bias circuit which ensures stable operation of the transistor 312. In particular, the resistors 352 and 354 set the base voltage of transistor 312. The resistor 356 in combination with the third cross-over network 374 set the DC value of the collector-to-emitter voltage of the transistor 312. The resistor 358 in combination with the first and second cross-over networks 370 and 372 set the DC current of the emitter of the transistor 312.

In the preferred embodiment, the transistor 312 is an npn 2N2222A transistor which is commonly available from a wide variety of transistor manufacturers. The capacitor 322 is 0.22 microfarads. The resistors 350 is 22 kilohms (kohm), the resistor 352 is 41.2 kohm, the resistor 356 is 10 kohm, and the resistor 358 is 6.8 kohm. One of ordinary skill in the art will recognize however, that a variety of transistors, capacitors and resistors with different values can be used to implement the differential perspective correction apparatus 102.

IV. Operation of the Preferred Differential Perspective Correction Apparatus

The unique differential perspective correction apparatus 102 creates two types of voltage gains, a common-mode voltage gain and a differential voltage gain. As explained above, the common-mode voltage gain is the change in the voltage which is common to both the left and right input terminals 300 and 302. The differential gain is the change in the output voltage due to the difference of the voltages applied to the left and right input terminals 300 and 302.

A. The Common-Mode Gain

In the differential perspective correction apparatus 102, the common-mode gain is designed to reduce the clipping which may result from high-amplitude input signals. In the preferred embodiment, the common-mode gain at the left output terminal 304 is primarily defined by the resistors 340, 342, 344, 346 and 348. In the preferred embodiment, the common-mode gain is approximately a negative six decibels.

Figure 4:
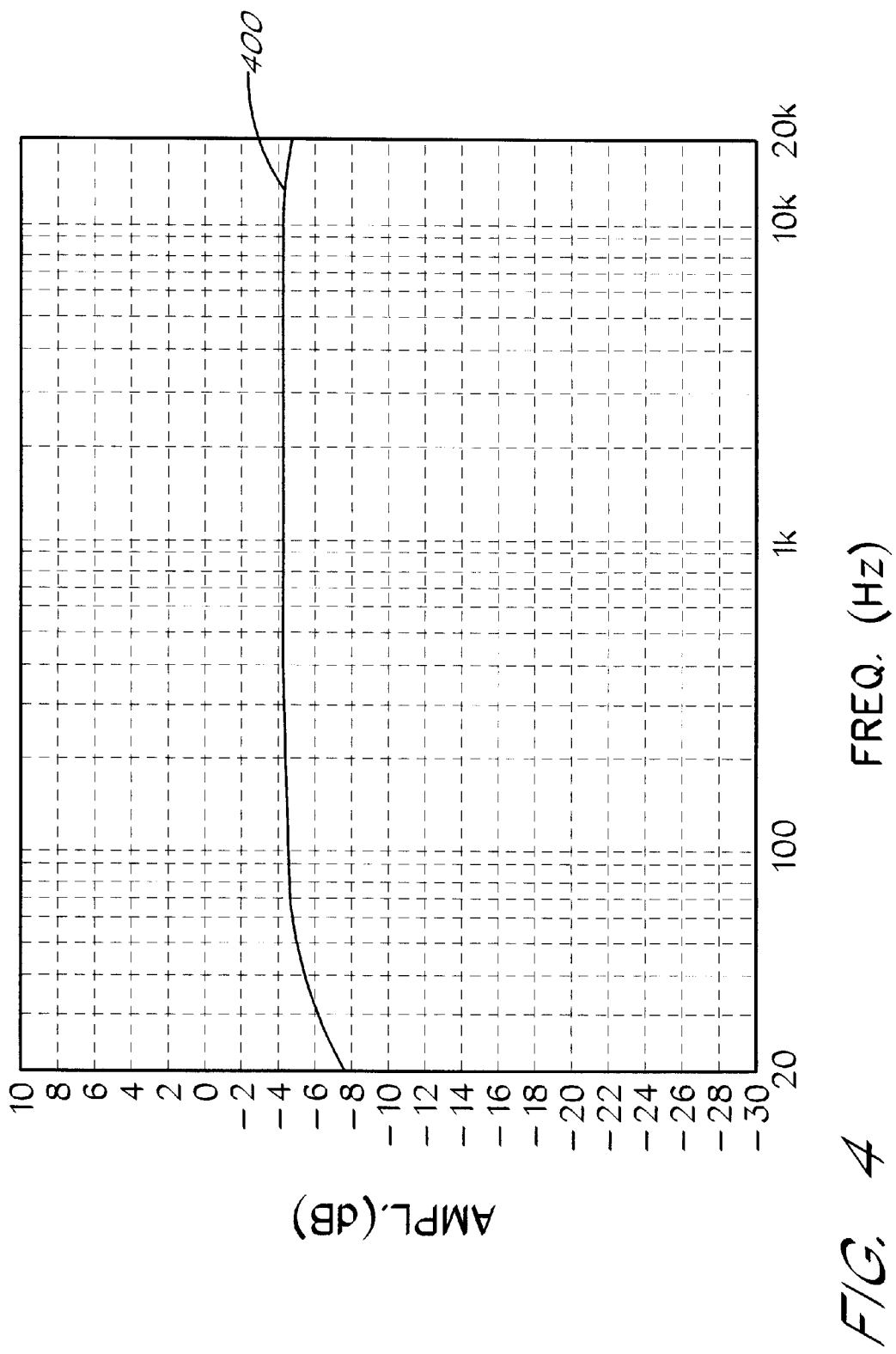
FIG. 4 illustrates a graphical representation of the common-mode gain of the preferred sound enhancement apparatus.

FIG. 4 is an amplitude-versus-frequency chart which illustrates the preferred common-mode gain at both the left and right output terminals 304 and 306. The common-mode gain is represented with a first common-mode gain curve 400. As shown in the common-mode gain curve 400, the frequencies below approximately 30 hertz (Hz) are de-emphasized more than the frequencies above approximately 30 Hz. For frequencies above approximately 30 Hz, the frequencies are uniformly reduced by approximately 6 decibels.

The common-mode gain, however, may vary for or a given implementation by varying the values of the resistors 340, 342, 344, 350, 352 and 354.

B. The Differential Gain

Focusing now on the differential gain, the differential gain at the left and right output terminals 304 and 306 is defined primarily by the ratio of the resistors 346 and 348, the ratio of the resistors 356 and 358, and the three cross-over networks 370, 372 and 374. As discussed in more detail below, the preferred embodiment equalizes certain frequency ranges in the differential input. Thus, the differential gain varies based on the frequency of the left and right input signals.

Because the cross-over networks 370, 372 and 374 equalize the frequency ranges in the differential input, the frequencies in the differential signal can be altered without affecting the frequencies in the common-mode signal. As a result, the preferred embodiment can create enhanced audio sound in an entirely unique and novel manner. Furthermore, the differential perspective correction apparatus 102 is much simpler and cost-effective to implement than many other audio enhancement systems.

Focusing now on the three cross-over networks 370, 372 and 374, the preferred cross-over networks 370, 372 and 374 act as filters which spectrally shape the differential signal. A filter is usually characterized as having a cut-off frequency which separates a passband of frequencies from a stopband of frequencies. The cut-off frequency is the frequency which marks the edge of the passband and the beginning of the transition to the stopband. Typically, the cut-off frequency is the frequency which is de-emphasized by three decibels relative to other frequencies in the passband. The passband of frequencies are those frequencies which pass through a filter with essentially no equalization or attenuation. The stopband of frequencies, on the other hand, are those frequencies which the filter equalizes or attenuates.

Figure 5:
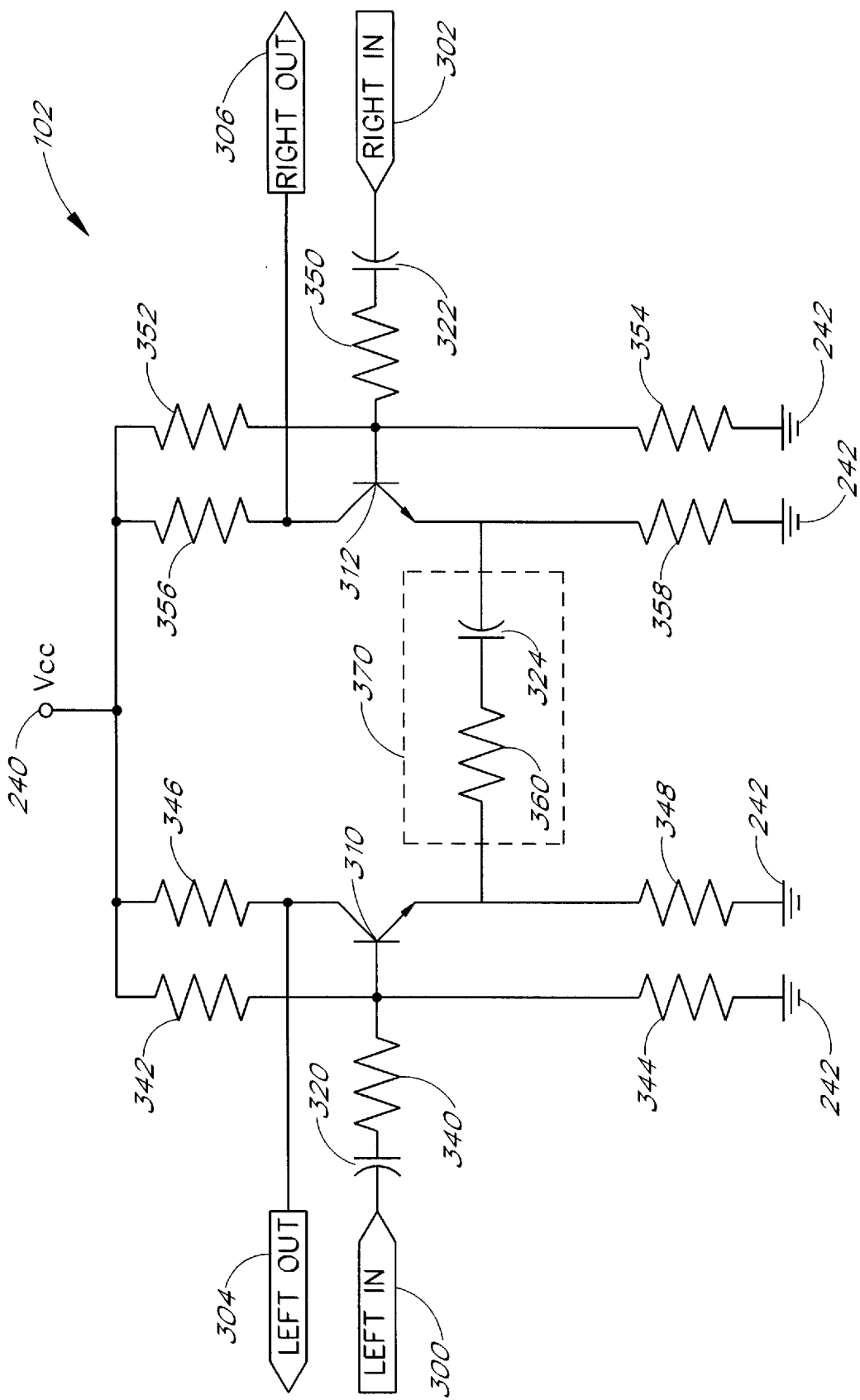
FIG. 5 is a schematic diagram of an embodiment of the sound enhancement apparatus with a first cross-over network.

FIG. 5 shows one embodiment of the present invention incorporating only the first cross-over network 370. The first cross-over network 370 comprises the resistor 360 and the capacitor 324 which interconnect the emitters of transistors 310 and 312. Because the first cross-over network 370 equalizes frequencies in the lower portion of the frequency spectrum, it is thus called a high-pass filter. In the preferred embodiment, the value of the resistor 360 is approximately 3 kohm and the value of the capacitor 324 is approximately 0.68 microfarads.

Figure 6:
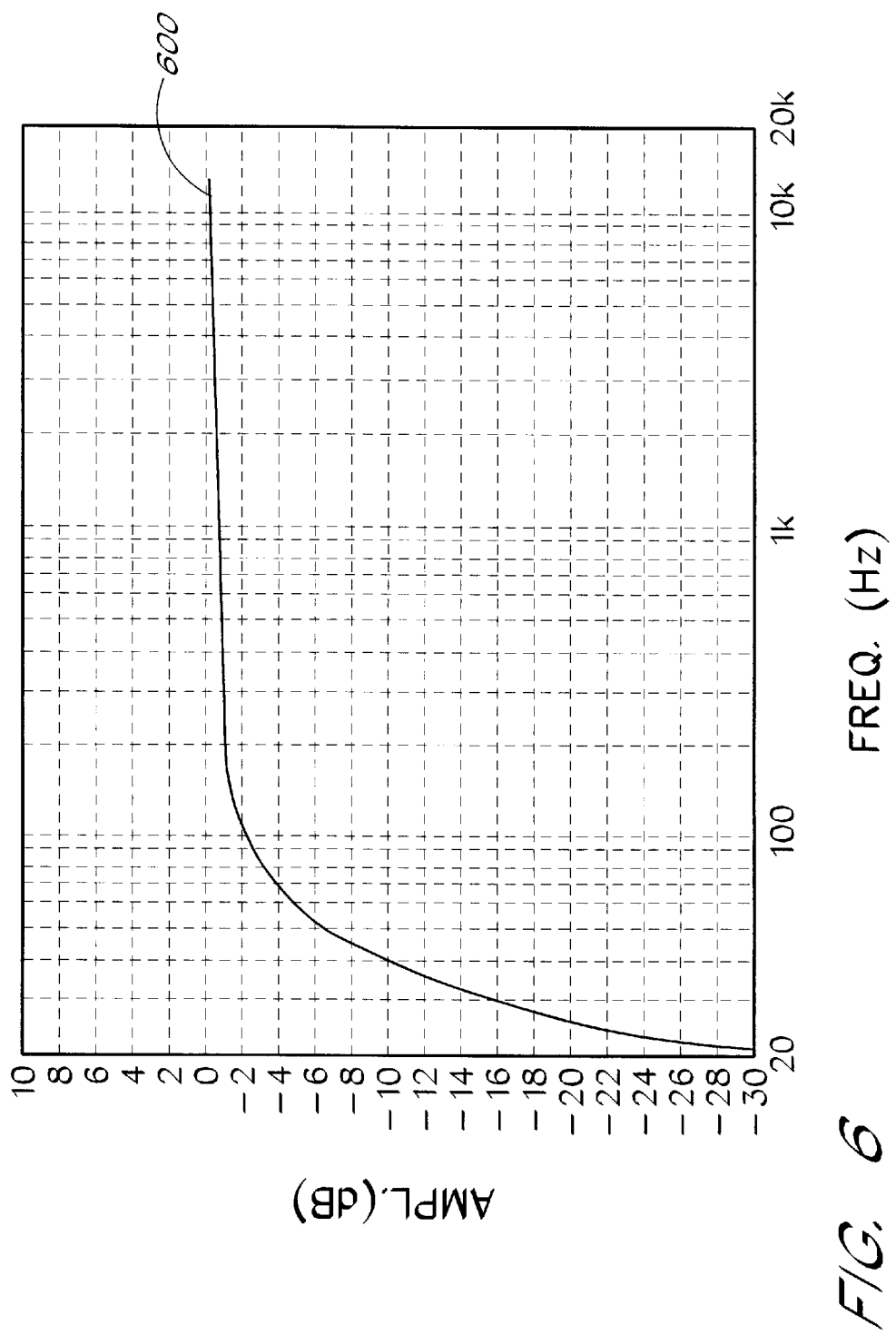
FIG. 6 illustrates a graphical representation of the differential signal equalization curve associated with a first cross-over network.

The values of the resistor 360 and the capacitor 324 are selected to define a cut-off frequency in a low range of frequencies. In the preferred embodiment, the cut-off frequency is approximately 78 Hz, a stopband below approximately 78 Hz and a passband above approximately 78 Hz. FIG. 6 illustrates the correction provided by the first cross-over network 370 as a first correction curve 600 having different amplitude-versus-frequency characteristics. The amplitude-versus-frequency characteristics are illustrated as a function of gain, measured in decibels, against audible frequencies displayed in a log format.

The first correction curve 600 illustrates that the frequencies below approximately 78 Hz are de-emphasized relative to frequencies above approximately 78 Hz. However, because the first cross-over network 370 is only a first-order filter, frequencies defining the cut-off frequency are design goals. The exact characteristic frequencies may vary for a given implementation. Furthermore, other values for the resistor 360 and the capacitor 324 can be chosen to vary the cut-off frequency in order to de-emphasize other desired frequencies.

Figure 7:
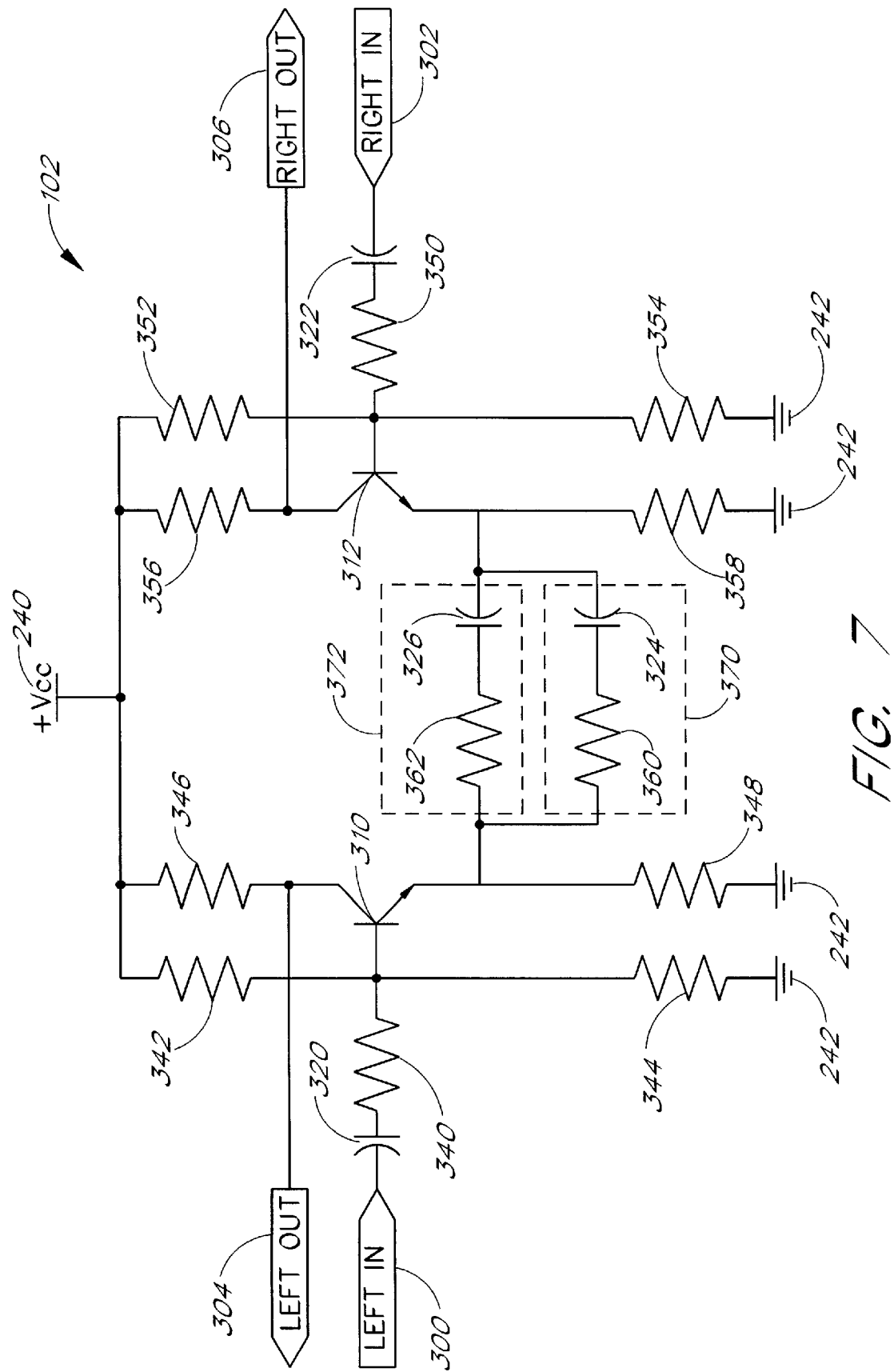
FIG. 7 is a schematic diagram of an embodiment of the preferred sound enhancement apparatus with two cross-over networks.

FIG. 7 illustrates a schematic diagram of the differential perspective correction apparatus 102 with both the second and third cross-over networks 370 and 372. Like the first cross-over network 370, the second cross-over network 372 is also preferably a filter which equalizes certain frequencies in the differential signal. Unlike the first cross-over network 370, however, the second cross-over network 372 is a high-pass filter which also de-emphasizes lower frequencies in the differential signal relative to the higher frequencies in the differential signal.

As shown in FIG. 7, the second cross-over network 372 interconnects the emitters of transistors 310 and 312. In addition, the second cross-over network 372 comprises the resistor 362 and the capacitor 326. Preferably, the value of the resistor 362 is approximately 1 kohm and the value of the capacitor 326 is approximately 0.01 microfarads.

Figure 8:
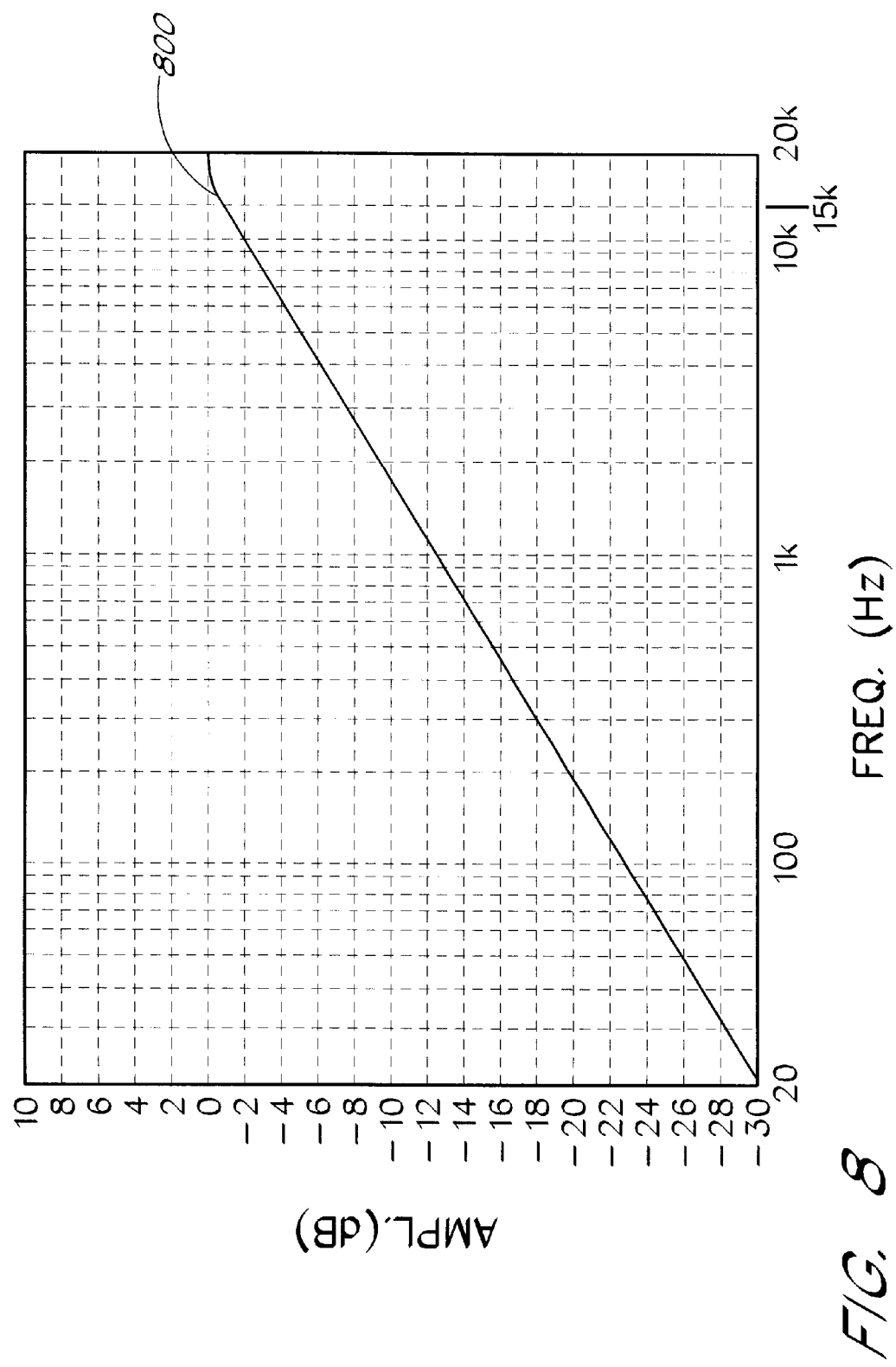
FIG. 8 illustrates a graphical representation of the differential signal equalization curve associated with a second cross-over network.

The values of the resistor 362 and capacitor 326 are selected to define a cut-off frequency in a high range of frequencies. In the preferred embodiment, the cut-off frequency of the cross-over network 372 is approximately 15.9 kilohertz (kHz). FIG. 8 illustrates the second correction curve 800 provided by the second cross-over network 372. The second correction curve 800 is also illustrated as a function of gain, measured in decibels, against audible frequencies displayed in a log format. The second correction curve 800 illustrates that the frequencies in the stopband below approximately 15.9 kHz are de-emphasized relative to frequencies in the passband above 15.9 kHz.

However, because the second cross-over network 372, like the first cross-over network 370, is a first-order filter, frequencies defining the passband are design goals. The exact characteristic frequencies may vary for a given implementation. Furthermore, other values for the resistor 362 and capacitor 326 can be chosen to vary the cut-off frequency so as to de-emphasize other desired frequencies.

Referring now to FIG. 3, the third cross-over network 374 interconnects the collectors of transistors 310 and 312. The third cross-over network 374 includes the resistor 364 and the capacitor 328 which are selected to create a low-pass filter which de-emphasizes frequencies above a mid-range of frequencies. In the preferred embodiment, the cut-off frequency of the low-pass filter is approximately 795 Hz. Preferably, the value of resistor 364 is approximately 9.09 kohm and the value of the capacitor 328 is approximately 0.022 microfarads.

Figure 9:
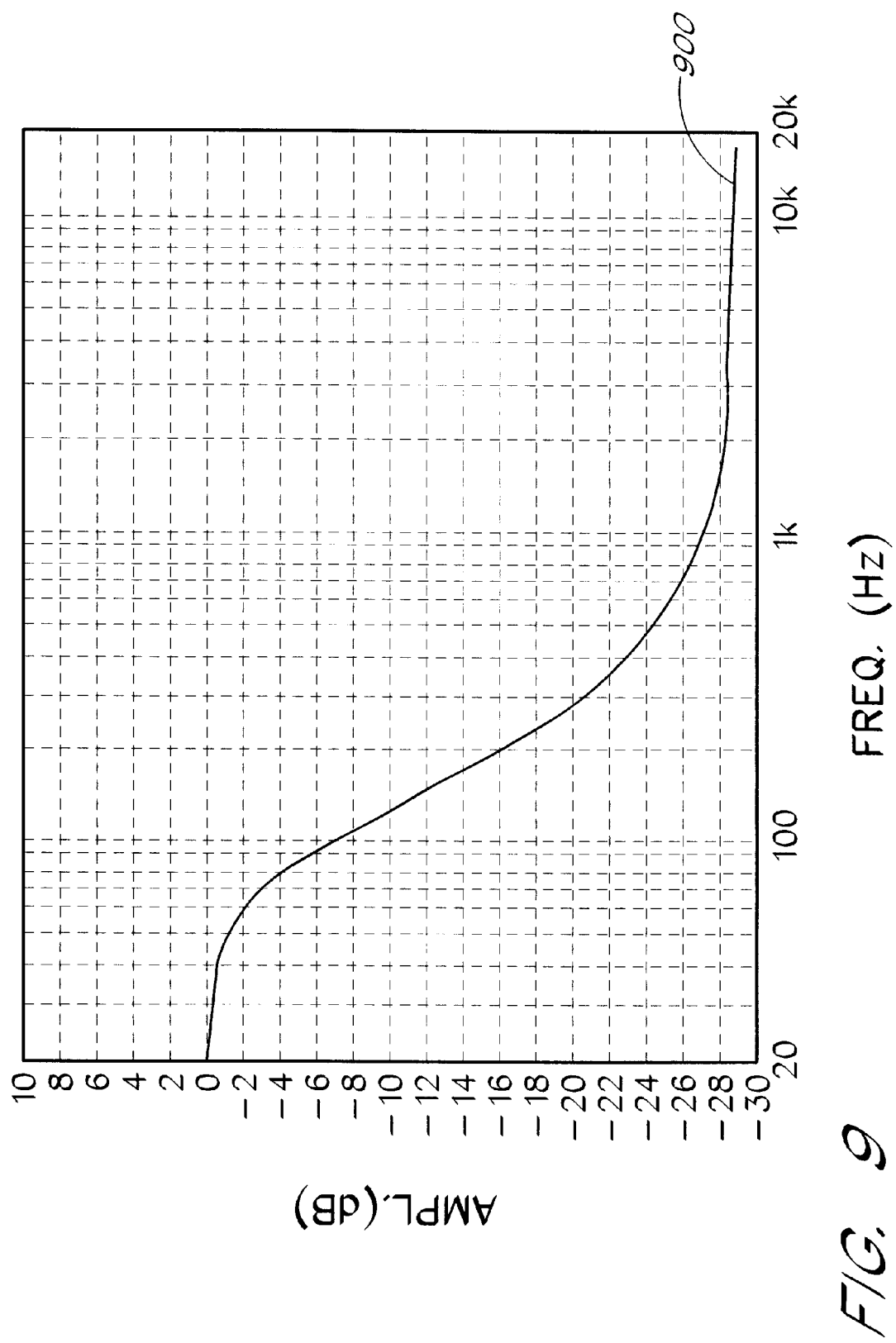
FIG. 9 illustrates a graphical representation of the differential signal equalization curve associated with a third cross-over network.

FIG. 9 illustrates a third correction curve 900 generated by the third cross-over network 374. The third correction curve 900 illustrates that the frequencies in the stopband above approximately 795 Hz are de-emphasized relative to frequencies in the passband below approximately 795 Hz. As discussed above, because the third cross-over network 374 is only a first-order filter, frequencies defining the low-pass filter in the third cross-over network 374 are design goals. The frequencies may vary for or given implementation. Furthermore, other values for resistor 364 and capacitor 328 can be chosen to vary the cut-off frequency so as to de-emphasize other desired frequencies.

Figure 10:
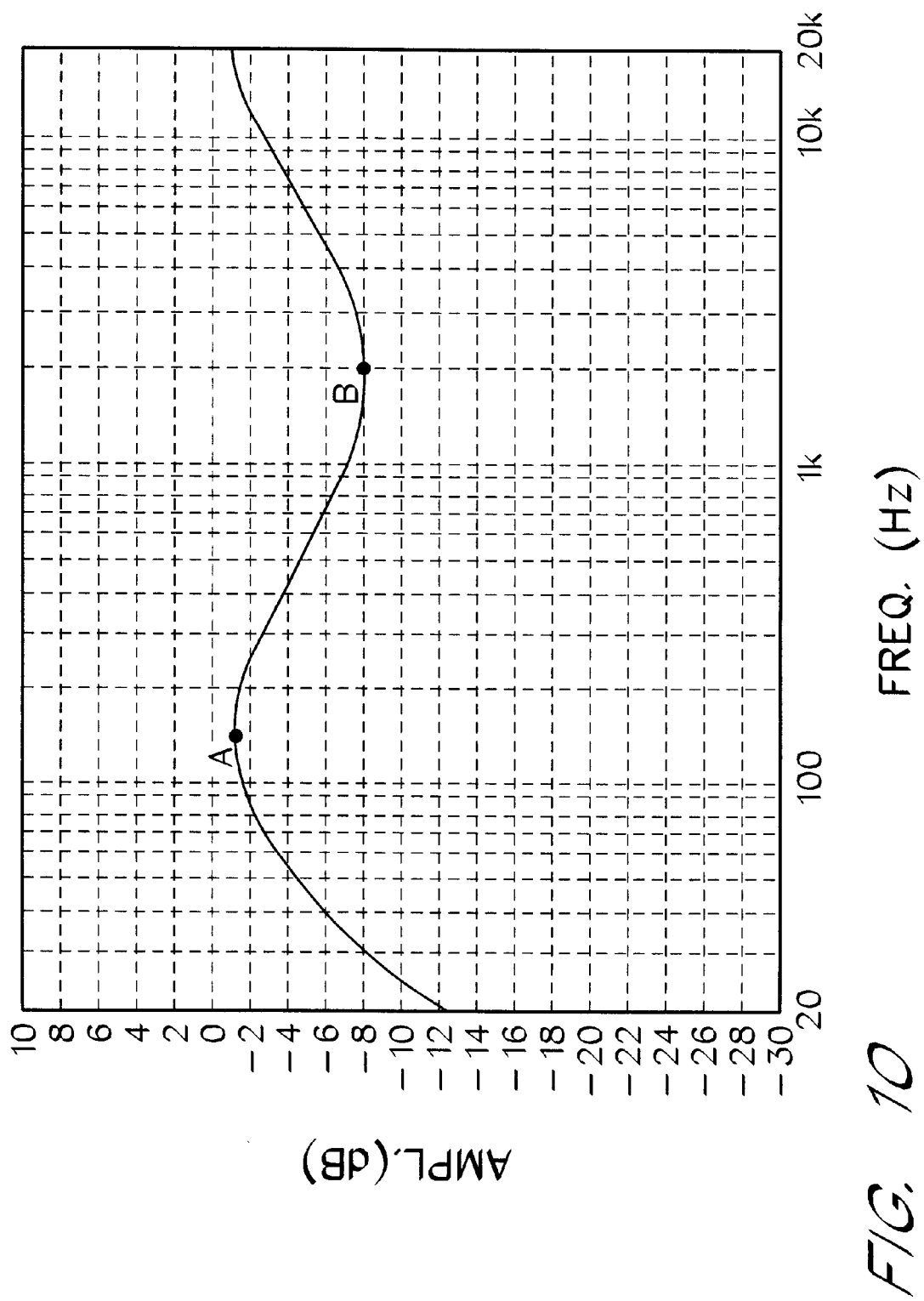
FIG. 10 illustrates a graphical representation of the overall differential signal equalization curve of the preferred sound enhancement apparatus.

In operation, the first, second and third cross-over networks 370, 372 and 374 work in combination to spectrally shape the differential signal. FIG. 10 illustrates the overall correction curve 800 generated by the combination of the first, second and third cross-over networks 370, 372 and 374. The approximate relative gain values of the various frequencies within the overall correction curve 800 can be measured against a zero (0) dB reference.

With such a reference, the overall correction curve 800 is defined by two turning points labelled as point A and point B. At point A, which in the preferred embodiment is approximately 125 Hz, the slope of the correction curve changes from a positive value to a negative value for increasing frequency levels. At point B, which in the preferred embodiment is approximately 1.8 kHz, the slope of the correction curve changes from a negative value to a positive value.

Thus, the frequencies below approximately 125 Hz are de-emphasized relative to the frequencies near 125 Hz. In particular, below 125 Hz, the gain of the overall correction curve 800 decreases at a rate of approximately 6 dB per octave. This de-emphasis of signal frequencies below 125 Hz prevents the over-emphasis of very low, i.e., bass, frequencies. With many audio reproduction systems, over emphasizing audio signals in this low-frequency range relative to the higher frequencies can create an unpleasurable and unrealistic sound image having too much bass response. Furthermore, over emphasizing these frequencies may damage a variety of audio components including the loudspeakers.

Between point A and point B, the slope of the preferred overall correction curve is negative. That is, the frequencies between approximately 125 Hz and approximately 1.8 kHz are de-emphasized relative to the frequencies near 125 Hz. Thus, the gain associated with the frequencies between point A and point B decrease at variable rates towards the maximum-equalization point of −8 dB at approximately 1.8 kHz.

Above 1.8 kHz the gain increases, at variable rates, up to approximately 20 kHz, i.e., approximately the highest frequency audible to the human ear. That is, the frequencies above approximately 1.8 kHz are emphasized relative to the frequencies near 1.8 kHz. Thus, the gain associated with the frequencies above point B increases at variable rates towards 20 kHz.

These relative gain and frequency values are merely design objectives and the actual figures will likely vary from circuit to circuit depending on the actual value of components used. Furthermore, the gain and frequency values may be varied based on the type of sound or upon user preferences without departing from the spirit of the invention. For example, varying the number of the cross-over networks and varying the resister and capacitor values within each cross-over network allows the overall perspective correction curve 800 be tailored to the type of sound reproduced.

The selective equalization of the differential signal enhances ambient or reverberant sound effects present in the differential signal. As discussed above, the frequencies in the differential signal are readily perceived in a live sound stage at the appropriate level. Unfortunately, in the playback of a recorded performance the sound image does not provide the same 360 degree effect of a live performance. However, by equalizing the frequencies of the differential signal with the preferred differential perspective correction apparatus 102, a projected sound image can be broadened significantly so as to reproduce the live performance experience with a pair of loudspeakers placed in front of the listener.

Equalization of the differential signal in accordance with the overall correction curve 800 is intended to de-emphasize the signal components of statistically lower intensity relative to the higher-intensity signal components. The higher-intensity differential signal components of a typical audio signal are found in a mid-range of frequencies between approximately 1 to 4 kHz. In this range of frequencies, the human ear has a heightened sensitivity. Thus, frequencies in the differential signal information are modified by perspective correction. Accordingly, the enhanced left and right output signals produce a much improved audio effect.

C. Other Embodiments

The number of cross-over networks and the components within the cross-over networks can be varied in other embodiments to simulate what are called head related transfer functions (HRTF). Head related transfer functions describe different signal equalizing techniques for adjusting the sound produced by a pair of loudspeakers so as to account for the time it takes for the sound to be perceived by the left and right ears. Advantageously, an immersive sound effect can be positioned by applying HRTF-based transfer functions to the differential signal so as to create a fully immersive positional sound field.

Examples of HRTF transfer functions which can be used to achieve a certain perceived azimuth are described in the article by E. A. B. Shaw entitled "Transformation of Sound Pressure Level From the Free Field to the Eardrum in the Horizontal Plane", J.Acoust.Soc.Am., Vol. 56, No. 6, December 1974, and in the article by S. Mehrgardt and V. Mellert entitled "Transformation Characteristics of the External Human Ear", J.Acoust.Soc.Am., Vol. 61, No. 6, June 1977, both of which are incorporated herein by reference as though fully set forth.

Figure 11:
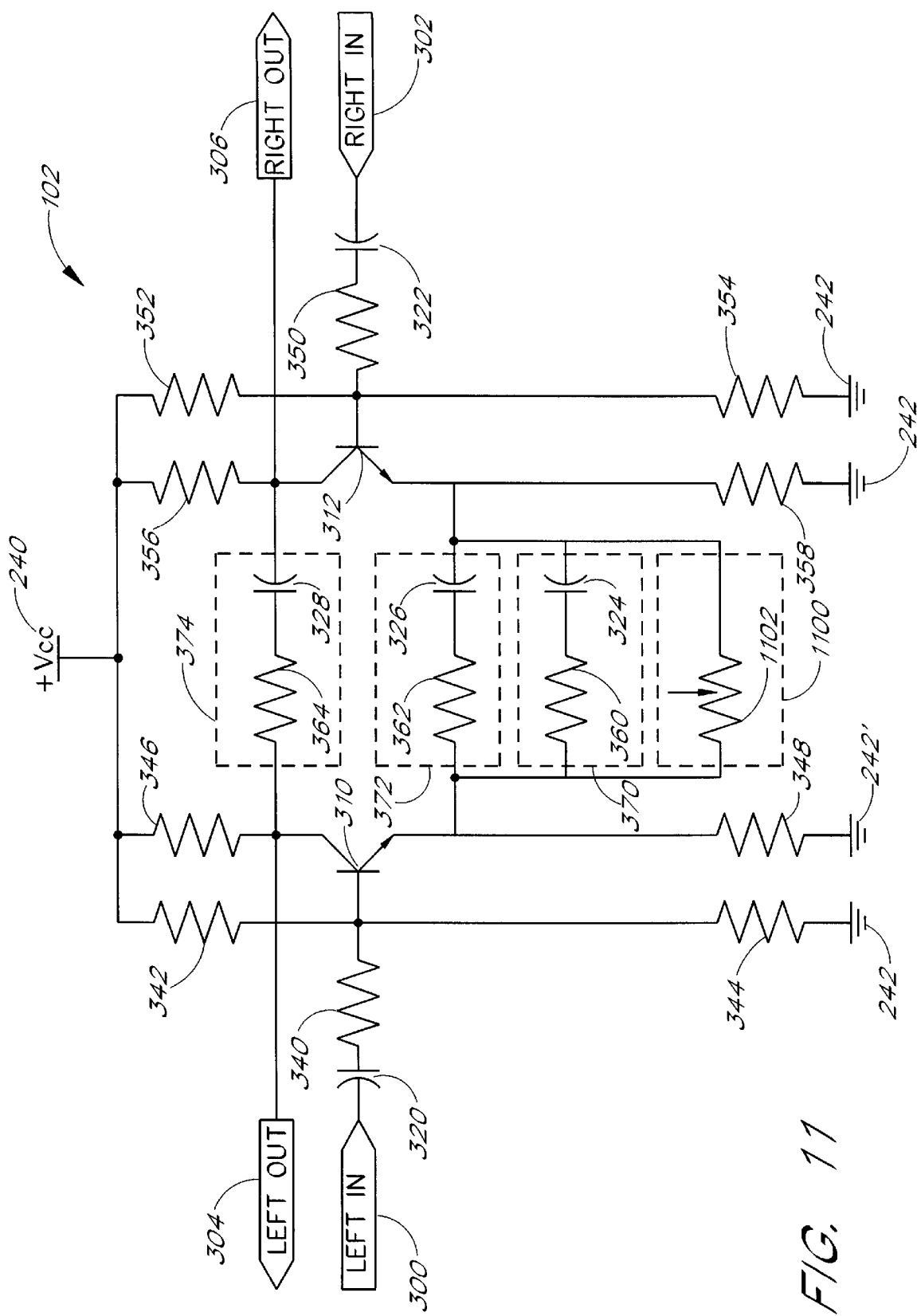
FIG. 11 illustrates another embodiment of the sound enhancement apparatus.

FIG. 11 illustrates another embodiment of the differential perspective correction apparatus 102 which allows a user to vary the amount of overall differential gain. In this embodiment, a fourth cross-over network 1100 interconnects the emitters of transistors 310 and 312. In this embodiment, the fourth cross-over network 1100 comprises a variable resister 1102.

The variable resister 1102 acts as a level-adjusting device and is ideally a potentiometer or similar variable-resistance device. Varying the resistance of the variable resister 1102 raises and lowers the relative equalization of the perspective correction circuit. Adjustment of the variable resistor is typically performed manually so that a user can tailor the level and aspect of the differential gain according to the type of sound reproduced, and based on the user's personal preferences. Typically, a decrease in the overall level of the differential signal reduces the ambient sound information creating the perception of a narrower sound image.

Figure 12:
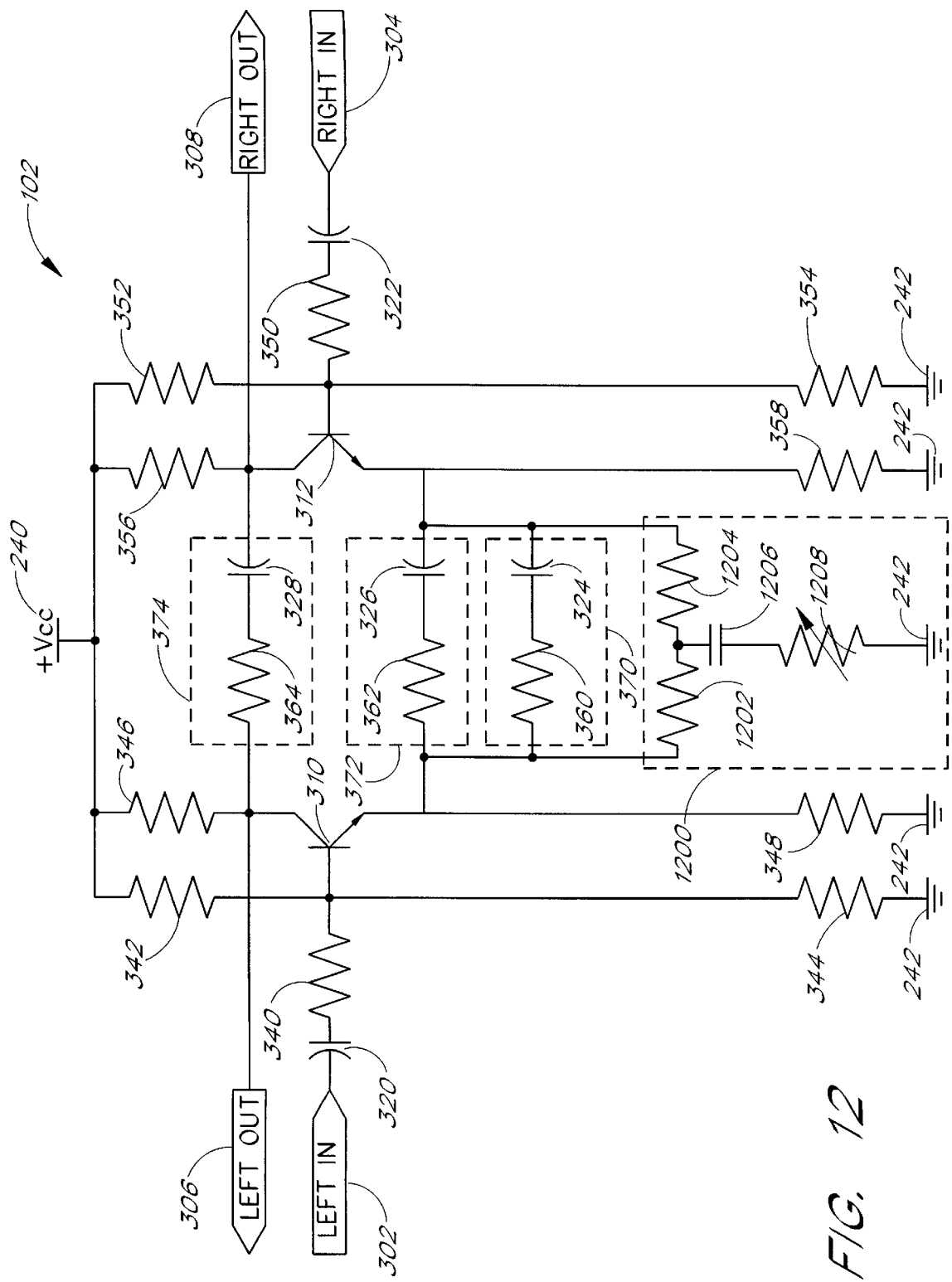
FIG. 12 illustrates yet another embodiment of the sound enhancement apparatus.

FIG. 12 illustrates an additional embodiment which allows a user to vary the amount of common-mode gain. In this embodiment, the differential perspective correction apparatus 102 contains a fourth cross-over network 1200.

The fourth cross-over network 1200 includes a resistor 1202, a resistor 1204, a capacitor 1206 and a variable resistor 1208. The capacitor 1206 removes the differential information and allows the variable resistor and resistors 1202 and 1204 to vary the common-mode gain.

The resistors 1202 and 1204 can be a wide variety of values depending on the desired range of common-mode gain. The variable resistor 1208, on the other hand, acts as a level-adjusting device which adjusts the common-mode gain within the desired range. Ideally, the variable resistor 1208 is a potentiometer or similar variable-resistance device. Varying the resistance of the variable resistor 1208 affects both transistors 310 and 312 equally and thereby raises and lowers the relative equalization of the overall common-mode gain.

Adjustment of the variable resistor is typically performed manually so that a user can tailor the level and aspect of the common-mode gain. An increase in the common-mode gain emphasizes the audio information which is common to both input signals 302 and 304. For example, increasing the common-mode gain in a sound system will emphasize the audio information at the center stage positioned between a pair of loudspeakers.

Figure 13:
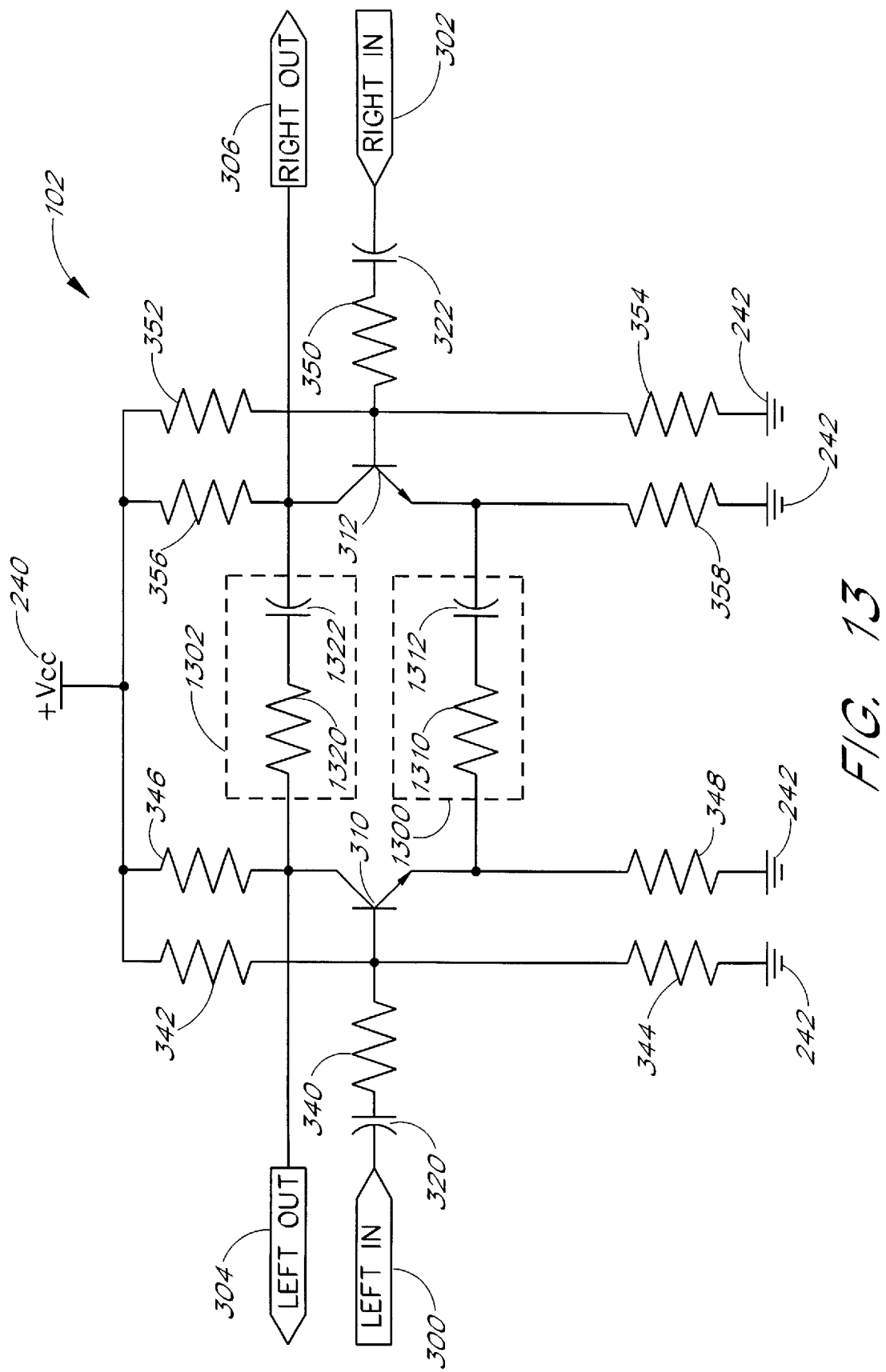
FIG. 13 illustrates a further alternative embodiment of the sound enhancement apparatus.

FIG. 13 illustrates another alternative embodiment of the differential perspective correction apparatus 102. In this embodiment, the differential perspective correction apparatus 102 has a first cross-over network 1300 located between the emitters of transistors 310 and 312 and a second cross-over network 1302 located between the collectors of transistors 310 and 312.

The first cross-over network 1300 is a high-pass filter which de-emphasizes frequencies in the lower portion of the frequency spectrum. In this embodiment, the first cross-over network 1300 comprises a resistor 1310 and a capacitor 1312. The values of the resistor 1310 and the capacitor 1312 are selected to define a high-pass filter with a cut-off frequency of approximately 350 Hz. Accordingly, the value of resistor 1310 is approximately 3 kohm and the value of the capacitor 1312 is approximately 0.15 microfarads. In operation, the frequencies below 350 Hz are de-emphasized relative to the frequencies above 350 Hz.

The second cross-over network 1302 interconnects the collectors of transistors 310 and 312. The second cross-over network 1302 is a low-pass filter which de-emphasizes frequencies in the lower portion of the frequency spectrum. In this embodiment, the second cross-over network 1302 comprises a resistor 1320 and a capacitor 1322.

The values of the resistor 1320 and the capacitor 1322 are selected to define a low-pass filter with a cut-off frequency of approximately 2.3 kHz. Accordingly, the value of the resistor 1320 is approximately 9.09 kohm and the value of the capacitor 1322 is approximately 0.0075 microfarads. In operation, the frequencies above 2.3 kHz are de-emphasized relative to the frequencies below 2.3 kHz.

Figure 14:
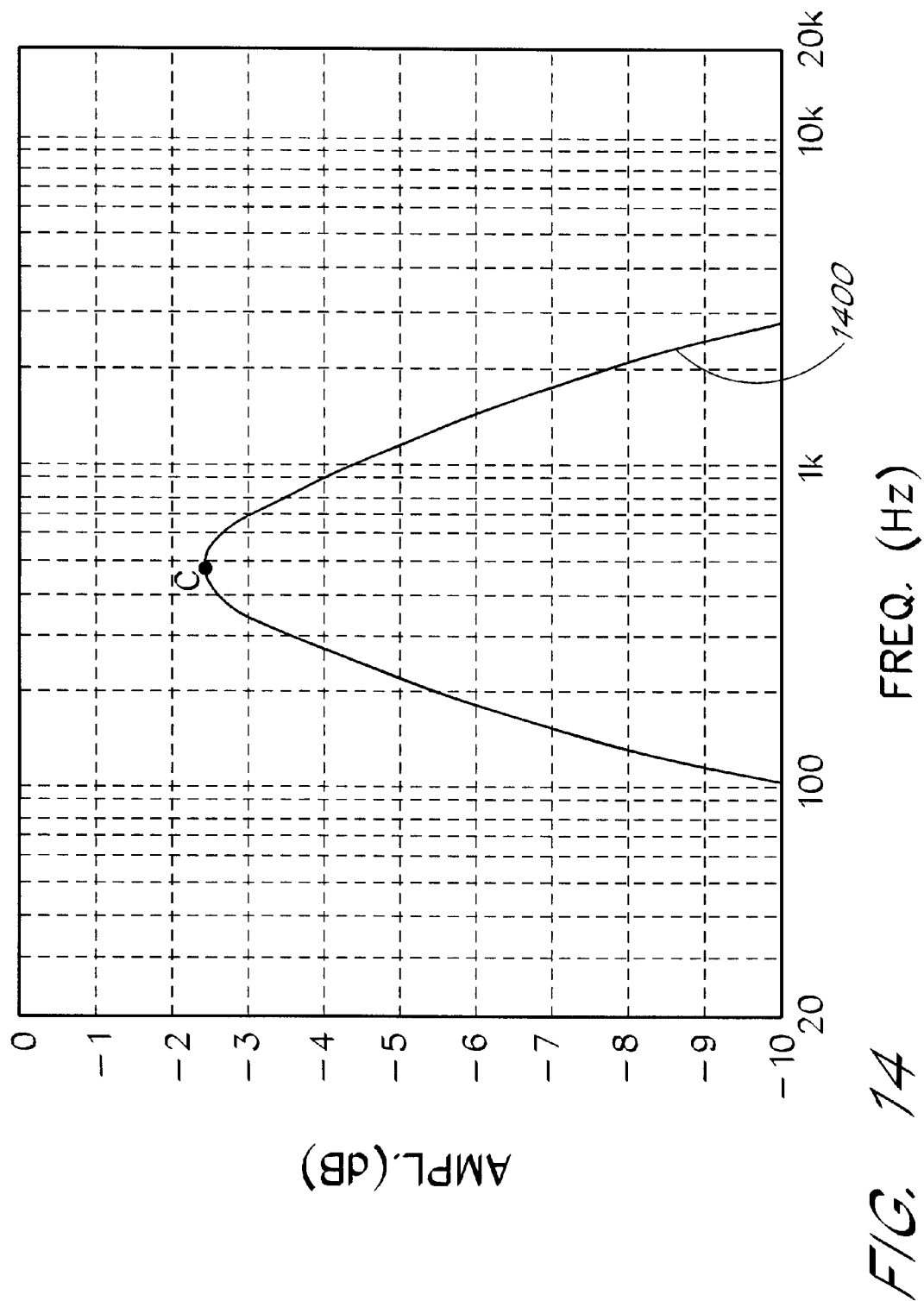
FIGS. 14 illustrates a graphical representation of the overall differential signal equalization curve of an alternative embodiment of the sound enhancement apparatus.

The first and second cross-over networks 1300 and 1302 work in combination to spectrally shape the differential signal. FIG. 14 illustrates the overall correction curve 1400 generated by the combination of the first and second cross-over networks 1300 and 1302 in this alternative embodiment. In FIG. 14, the overall correction curve 1400 is represented as a function of gain, measured in decibels, against audible frequencies displayed in a log format. In addition, the overall correction curve is measured against a zero (0) dB reference.

With a zero dB reference, the overall correction curve 1400 is defined by a single turning point labelled as point C. At point C, which in the preferred embodiment is approximately 500 Hz, the slope of the overall correction curve 1400 changes from a positive value to a negative value. Thus, the frequencies below approximately 500 Hz are de-emphasized relative to the frequencies near 500 Hz. Furthermore, above 500 Hz, the gain of the overall correction curve 1400 also decreases relative to the frequencies near 500 Hz.

D. The Output Buffers

Figure 15:
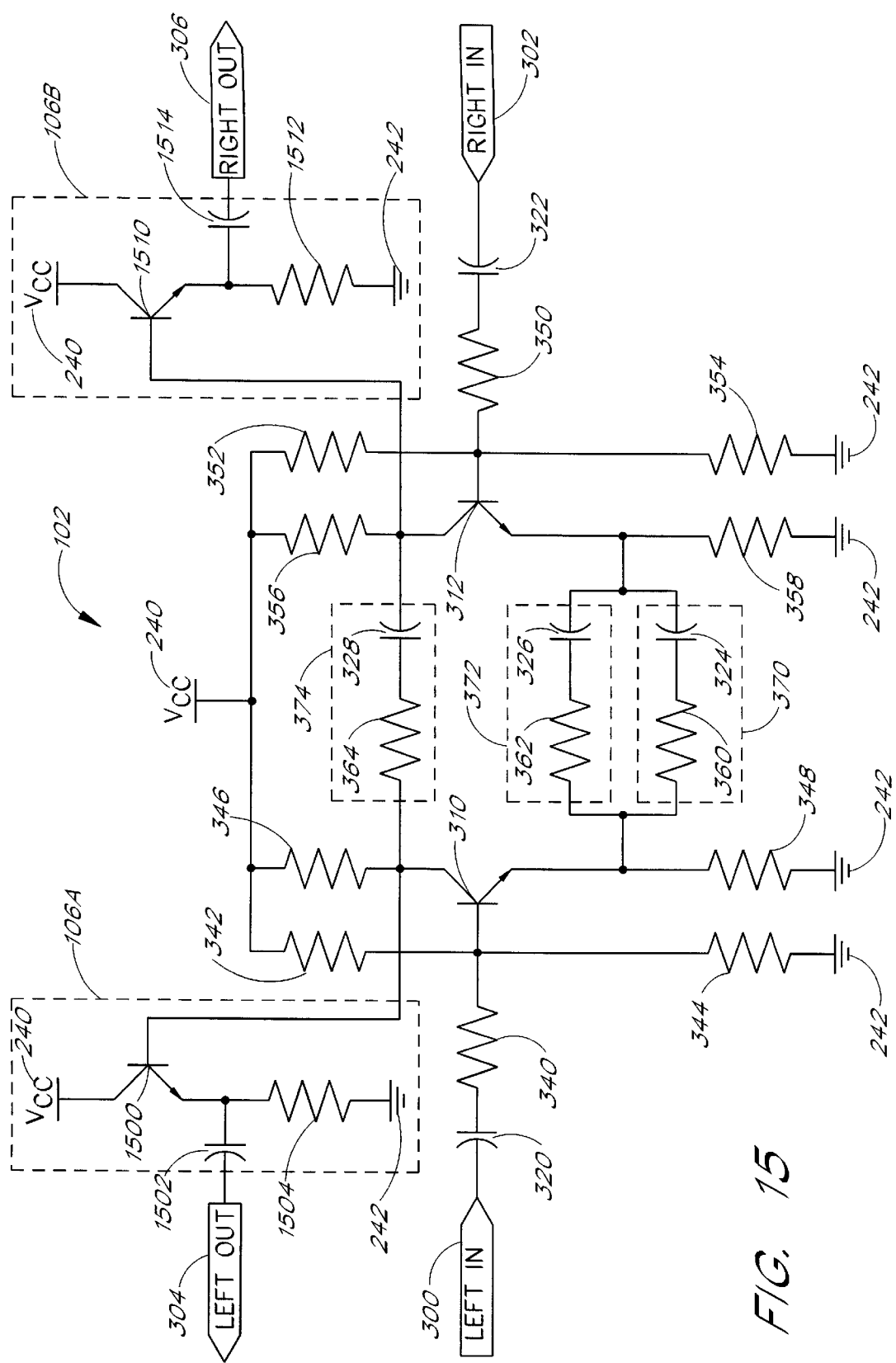
FIG. 15 is a schematic diagram of the preferred sound enhancement apparatus connected to a set of output buffers.

The sound enhancement system of the preferred embodiment also includes the output buffers 106 as illustrated in FIG. 15. The output buffers 106 are designed to isolate the perspective correction differential apparatus 102 from variations in the load presented by a circuit connected to the left and right output terminals 304 and 306. For example, when the left and right output terminals 304 and 306 are connected to a pair of loudspeakers, the impedance load of the loudspeakers will not alter the manner in which the differential perspective correction apparatus 102 equalizes the differential signal. Accordingy, without the output buffers 106, circuits, loudspeakers and other components will affect the manner in which the differential perspective correction apparatus 102 equalizes the differential signal.

In the preferred embodiment, the left output buffer 106A includes a left output transistor 1500, a resistor 1504 and a capacitor 1504. The power supply $V_{CC}$ 240 is connected directly to the collector of transistor 1500. The emitter of transistor 1500 is connected to ground 242 through the resistor 1504 and to the left output terminal 304 through the capacitor 1502. In addition, the base of transistor 1500 is connected to the collector of the transistor 310.

In the preferred embodiment, the transistor 1500 is an npn 2N2222A transistor, the resistor 1504 is 1 kohms and the capacitor 1502 is 0.22 microfarads. The resistor 1504, the capacitor 1502 and the transistor 1500 create a unity gain. That is, the left output buffer 106A primarily passes the enhanced sound signals to the left output terminal 304 without further equalizing the enhanced sound signals.

Likewise, the preferred right output buffer 106B includes a right output transistor 1510, a resistor 1512 and a capacitor 1514. The power supply $V_{CC}$ 240 is connected directly to the collector of the transistor 1510. The emitter of transistor 1510 is connected to ground 242 through the resistor 1512 and to the right output terminal through the capacitor 1514. In addition, the base of transistor 1510 is connected to the collector of transistor 312.

In the presently preferred embodiment, the transistor 1510 is an npn 2N2222A transistor, the resistor 1512 is 1 kohm and the capacitor 1514 is 0.22 microfarads. The resistor 1512, the capacitor 1514 and the transistor 1510 create a unity gain. That is, the right output buffer 106B primarily passes the enhanced sound signals to the right output terminal 306 without further equalizing the enhanced sound signals.

V. Conclusion

While certain preferred embodiments of the invention have been described, these embodiments have been presented by way of example only, and are not intended to limit the scope of the present invention. For example, although the invention described herein uses multiple cross-over networks 170, 172 and 174 with a variety of resistor and capacitor values, a circuit designer can utilize fewer cross-over networks or more cross-over networks or additional components within the cross-over networks to customize the overall differential and common-mode signals. Accordingly, the breadth and scope of the present invention should be defined only in accordance with the following claims and their equivalents.

What is claimed is:

1. An audio enhancement system comprising:
   at least two audio signals, said audio signals having common-mode information which is common to said audio signals and differential information which is not common to said audio signals;

a first transistor in communication with one of said audio signals, said first transistor having a first collector and a first emitter;

a second transistor in communication with one of said audio signals, said second transistor having a second collector and a second emitter;

a first filter in communication with said first emitter and said second emitter, said first filter configured to modify a first set of frequencies in said differential information to create a first set of modified differential information;

a second filter in communication with said first emitter and said second emitter, said second filter configured to modify a second set of frequencies in said differential information to create a second set of modified differential information; and a third filter in communication with said first collector and said second collector, said third filter configured to modify a third set of frequencies in said differential information to create a third set of modified differential information, wherein said first, second and third sets of modified differential information are combined with said common-mode information to create at least two enhanced output signals.

2. The audio enhancement system of claim 1 wherein said modified first set of frequencies de-emphasizes frequencies in a low frequency range relative to frequencies above said low frequency range.

3. The audio enhancement system of claim 1 wherein said modified second set of frequencies de-emphasizes frequencies below a high frequency range relative to frequencies in said high frequency range.

4. The audio enhancement system of claim 1 wherein said modified third set of frequencies de-emphasizes frequencies below a mid frequency range relative to frequencies in said mid frequency range.

5. The audio enhancement system of claim 1 wherein said first, second and third set of modified frequencies in said differential information are combined to create a corrected differential curve.

6. The audio enhancement system of claim 5 wherein said corrected differential curve de-emphasizes frequencies below approximately 125 hertz relative to frequencies near approximately 125 hertz.

7. The audio enhancement system of claim 5 wherein said corrected differential curve de-emphasizes frequencies between approximately 125 hertz and approximately 1.8 kilohertz relative to frequencies near approximately 125 hertz.

8. The audio enhancement system of claim 5 wherein said corrected differential curve emphasizes frequencies above approximately 1.8 kilohertz relative to frequencies near approximately 1.8 kilohertz.

9. An audio enhancement system comprising:

an audio generator configured to output at least two audio signals;

a pair of circuits coupled to said audio generator, said pair of circuits are configured to distinguish common-mode information which is common to said audio signals from differential information which is not common to said audio signals; and a first cross-over network in communication with said pair of circuits, said first cross-over network configured to emphasize a first set of frequencies in said differential information relative to a second set of frequencies in said differential information, wherein said pair of circuits are further configured to alter said common-mode information in a different manner than said differential information, and wherein a portion of the frequencies in said common-mode information is adjusted by a desired number of decibels.

10. The audio enhancement system of claim 9 wherein said pair of circuits are a pair of amplifiers.

11. The audio enhancement system of claim 9 wherein said pair of circuits are a pair of transistors.

12. The audio enhancement system of claim 9 wherein said first cross-over network comprises at least one resistor and one capacitor.

13. The audio enhancement system of claim 9 wherein said pair of circuits output a combination of said common-mode information and said modified differential information as a pair of output signals.

14. The audio enhancement system of claim 13 further comprising at least two output buffers coupled to said pair of circuits, said output buffers configured to buffer said output signals from said pair of circuits.

15. The audio enhancement system of claim 14 further comprising at least two speakers coupled to said output signals, said speakers configured to reproduce an enhanced sound image.

16. An audio enhancement system comprising:

an audio generator configured to output at least two audio signals;

a pair of circuits coupled to said audio generator, said pair of circuits are configured to distinguish common-mode information which is common to said audio signals from differential information which is not common to said audio signals; and a first cross-over network in communication with said pair of circuits, said first cross-over network configured to emphasize a first set of frequencies in said differential information relative to a second set of frequencies in said differential information and a second cross-over network in communication with said pair of circuits, said second cross-over network configured to modify a second set of frequencies in said differential information in a different manner than said first set of frequencies modified by said first cross-over network, wherein said first and second set of modified frequencies in said differential information create a corrected differential curve wherein frequencies below a mid range of frequencies are de-emphasized relative to frequencies in said mid range of frequencies.

17. The audio enhancement system of claim 16 wherein said pair of circuits are further configured to alter said common-mode information in a different manner than said differential information.

18. An audio enhancement system comprising:

an audio generator configured to output at least two audio signals;

a pair of circuits coupled to said audio generator, said pair of circuits are configured to distinguish common-mode information which is common to said audio signals from differential information which is not common to said audio signals; and a first cross-over network in communication with said pair of circuits, said first cross-over network configured to emphasize a first set of frequencies in said differential information relative to a second set of frequencies in said differential information and a second cross-over network in communication with said pair of circuits, said second cross-over network configured to modify a second set of frequencies in said differential information in a different manner than said first set of frequencies modified by said first cross-over network, wherein said first and second set of modified frequencies in said differential information create a corrected differential curve wherein frequencies above a mid range of frequencies are de-emphasized relative to frequencies in said mid range of frequencies.

19. An audio enhancement system comprising:

an audio generator configured to output at least two audio signals;

a pair of circuits coupled to said audio generator, said pair of circuits are configured to distinguish common-mode information which is common to said audio signals from differential information which is not common to said audio signals; and a first cross-over network in communication with said pair of circuits, said first cross-over network configured to emphasize a first set of frequencies in said differential information relative to a second set of frequencies in said differential information and a second cross-over network in communication with said pair of circuits, said second cross-over network configured to modify a second set of frequencies in said differential information in a different manner than said first set of frequencies modified by said first cross-over network, wherein said first and second set of modified frequencies in said differential information create a corrected differential curve wherein frequencies below approximately 5 kilohertz are de-emphasized relative to frequencies at approximately 5 kilohertz.

20. An audio enhancement system comprising:

an audio generator configured to output at least two audio signals;

a pair of circuits coupled to said audio generator, said pair of circuits are configured to distinguish common-mode information which is common to said audio signals from differential information which is not common to said audio signals; and a first cross-over network in communication with said pair of circuits, said first cross-over network configured to emphasize a first set of frequencies in said differential information relative to a second set of frequencies in said differential information and a second cross-over network in communication with said pair of circuits, said second cross-over network configured to modify a second set of frequencies in said differential information in a different manner than said first set of frequencies modified by said first cross-over network, wherein said first and second set of modified frequencies in said differential information are combined to create a corrected differential curve wherein frequencies above approximately 5 kilohertz are de-emphasized relative to frequencies at approximately 5 kilohertz.

21. A method of enhancing audio information comprising the steps of:

directing at least two audio signals to a pair of transistors which distinguish common-mode information which is common to said audio signals from differential information which is not common to said audio signals; and spectrally shaping said differential information with multiple cross-over networks which are in communication with said transistors wherein said step of spectrally shaping creates a corrected differential curve wherein a low range of frequencies are de-emphasized relative to frequencies above said low range of frequencies.

22. The method of claim 21 further comprising the step of variably adjusting said spectral shaping.

23. The method of claim 21 further comprising the step of modifying said common-mode information.

24. The method of claim 23 wherein said step of modifying said common-mode information modifies said common-mode information in a different manner than said differential information.

25. The method of claim 23 further comprising the step of variably modifying said common-mode information.

26. The method of claim 21 further comprising the step of combining said spectrally shaped differential information and said common-mode information to create at least two output signals.

27. The method of claim 26 further comprising the steps of coupling said output signals to at least two speakers.

28. The method of claim 26 further comprising the steps of coupling said output signals to an audio processing device.

29. A method of enhancing audio information comprising the steps of:

directing at least two audio signals to a pair of transistors which distinguish common-mode information which is common to said audio signals from differential information which is not common to said audio signals; and spectrally shaping said differential information with multiple cross-over networks which are in communication with said transistors, wherein said step of spectrally shaping creates a corrected differential curve wherein frequencies below approximately 125 hertz are de-emphasized relative to frequencies near 125 hertz.

30. A method of enhancing audio information comprising the steps of:

directing at least two audio signals to a pair of transistors which distinguish common-mode information which is common to said audio signals from differential information which is not common to said audio signals; and spectrally shaping said differential information with multiple cross-over networks which are in communication with said transistors, wherein said step of spectrally shaping creates a corrected differential curve wherein a mid range of frequencies are de-emphasized relative to frequencies at the beginning of said mid range of frequencies.

31. A method of enhancing audio information comprising the steps of:

directing at least two audio signals to a pair of transistors which distinguish common-mode information which is common to said audio signals from differential information which is not common to said audio signals; and spectrally shaping said differential information with multiple cross-over networks which are in communication with said transistors, wherein said step of spectrally shaping creates a corrected differential curve wherein frequencies between approximately 125 hertz and approximately 1.8 kilohertz are de-emphasized relative to frequencies near 125 hertz.

32. A method of enhancing audio information comprising the steps of:

directing at least two audio signals to a pair of transistors which distinguish common-mode information which is common to said audio signals from differential information which is not common to said audio signals; and spectrally shaping said differential information with multiple cross-over networks which are in communication with said transistors wherein said step of spectrally shaping creates a corrected differential curve wherein frequencies above approximately 1.8 kilohertz are emphasized relative to frequencies near 1.8 kilohertz.

33. An audio enhancement system comprising:
a pair of circuits that receive at least a pair of audio signals, said pair of circuits are configured to distinguish common-mode information which is common to said audio signals from differential information which is not common to said audio signals; and
a first cross-over network in communication with said pair of circuits, said first cross-over network configured to emphasize a first set of frequencies in said differential information relative to a second set of frequencies in said differential information and a second cross-over network in communication with said pair of circuits, said second cross-over network configured to modify a second set of frequencies in said differential information in a different manner than said first set of frequencies modified by said first cross-over network.

34. The audio enhancement system of claim 33 wherein said pair of circuits are a pair of amplifiers.

35. The audio enhancement system of claim 33 wherein said pair of circuits are a pair of transistors.

36. The audio enhancement system of claim 33 wherein said first cross-over network comprises at least one resistor and one capacitor.

37. The audio enhancement system of claim 33 wherein said pair of circuits output a combination of said common-mode information and said modified differential information as a pair of output signals.

38. The audio enhancement system of claim 33 further comprising at least two output buffers coupled to said pair of circuits, said output buffers configured to buffer said output signals from said pair of circuits.

39. The audio enhancement system of claim 33 further comprising at least two speakers coupled to said output signals, said speakers configured to reproduce an enhanced sound image.

40. The audio enhancement system of claim 33 wherein said first and second set of modified frequencies in said differential information create a corrected differential curve wherein frequencies below a mid range of frequencies are de-emphasized relative to frequencies in said mid range of frequencies.

41. The audio enhancement system of claim 33 wherein said first and second set of modified frequencies in said differential information create a corrected differential curve wherein frequencies above a mid range of frequencies are de-emphasized relative to frequencies in said mid range of frequencies.

42. The audio enhancement system of claim 33 wherein said first and second set of modified frequencies in said differential information create a corrected differential curve wherein frequencies below approximately 5 kilohertz are de-emphasized relative to frequencies at approximately 5 kilohertz.

43. A method of enhancing audio information comprising the steps of:
receiving at least two audio signals with a pair of circuits which distinguish common-mode information which is common to said audio signals from differential information which is not common to said audio signals; and
spectrally shaping said differential information with multiple cross-over networks which are in communication with said pair of circuits, wherein said step of spectrally shaping creates a corrected differential curve wherein a low range of frequencies are de-emphasized relative to frequencies above said low range of frequencies.

44. The method of claim 43 further comprising the step of variably adjusting said spectral shaping.

45. The method of claim 43 further comprising the step of modifying said common-mode information.

46. The method of claim 45 wherein said step of modifying said common-mode information modifies said common-mode information in a different manner than said differential information.

47. The method of claim 45 further comprising the step of variably modifying said common-mode information.

48. The method of claim 43 further comprising the step of combining said spectrally shaped differential information and said common-mode information to create at least two output signals.

49. The method of claim 48 further comprising the steps of coupling said output signals to at least two speakers.

50. The method of claim 48 further comprising the steps of coupling said output signals to an audio processing device.

51. A method of enhancing audio information comprising the steps of:
receiving at least two audio signals with a pair of circuits which distinguish common-mode information which is common to said audio signals from differential information which is not common to said audio signals; and
spectrally shaping said differential information with multiple cross-over networks which are in communication with said pair of circuits, wherein said step of spectrally shaping creates a corrected differential curve wherein frequencies below approximately 125 hertz are de-emphasized relative to frequencies near 125 hertz.

52. A method of enhancing audio information comprising the steps of:
receiving at least two audio signals with a pair of circuits which distinguish common-mode information which is common to said audio signals from differential information which is not common to said audio signals; and
spectrally shaping said differential information with multiple cross-over networks which are in communication with said pair of circuits, wherein said step of spectrally shaping creates a corrected differential curve wherein a mid range of frequencies are de-emphasized relative to frequencies at the beginning of said mid range of frequencies.

53. A method of enhancing audio information comprising the steps of:
receiving at least two audio signals with a pair of circuits which distinguish common-mode information which is common to said audio signals from differential information which is not common to said audio signals; and
spectrally shaping said differential information with multiple cross-over networks which are in communication with said pair of circuits, wherein said step of spectrally shaping creates a corrected differential curve wherein frequencies between approximately 125 hertz and approximately 1.8 kilohertz are de-emphasized relative to frequencies near 125 hertz.

54. A method of enhancing audio information comprising the steps of:
receiving at least two audio signals with a pair of circuits which distinguish common-mode information which is common to said audio signals from differential information which is not common to said audio signals; and
spectrally shaping said differential information with multiple cross-over networks which are in communication with said pair of circuits, wherein said step of spectrally shaping creates a corrected differential curve wherein frequencies above approximately 1.8 kilohertz are emphasized relative to frequencies near 1.8 kilohertz.

55. The audio enhancement system of claim 33 wherein said first and second set of modified frequencies in said differential information are combined to create a corrected differential curve wherein frequencies above approximately 5 kilohertz are de-emphasized relative to frequencies at approximately 5 kilohertz.

56. The audio enhancement system of claim 33 wherein said pair of circuits are further configured to alter said common-mode information in a different manner than said differential information.

57. The audio enhancement system of claim 56 wherein a portion of the frequencies in said common-mode information is adjusted by a desired number of decibels.

* * * * *